US010783975B2

(12) United States Patent
Shimura et al.

(10) Patent No.: US 10,783,975 B2
(45) Date of Patent: Sep. 22, 2020

(54) SEMICONDUCTOR MEMORY DEVICE

(71) Applicant: TOSHIBA MEMORY CORPORATION, Minato-ku (JP)

(72) Inventors: Yasuhiro Shimura, Yokohama (JP); Koki Ueno, Yokohama (JP); Go Shikata, Moriya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/561,880

(22) Filed: Sep. 5, 2019

(65) Prior Publication Data
US 2020/0273530 A1 Aug. 27, 2020

(30) Foreign Application Priority Data
Feb. 27, 2019 (JP) .................................. 2019-033584

(51) Int. Cl.
*G11C 16/06* (2006.01)
*G11C 16/34* (2006.01)
*G11C 16/08* (2006.01)
*G11C 16/30* (2006.01)
*G11C 16/24* (2006.01)
*G11C 16/10* (2006.01)

(52) U.S. Cl.
CPC .......... *G11C 16/3459* (2013.01); *G11C 16/08* (2013.01); *G11C 16/10* (2013.01); *G11C 16/24* (2013.01); *G11C 16/30* (2013.01)

(58) Field of Classification Search
CPC ............ G11C 16/0483; G11C 16/3459; G11C 11/5628; G11C 16/10; G11C 2211/5621; G11C 16/14; G11C 16/3418; G11C 16/349; G11C 2211/5648; G11C 2216/14; G11C 16/08; G11C 16/26
USPC ............ 365/185.17, 185.03, 185.22, 185.02, 365/185.11, 185.18, 189.16
See application file for complete search history.

(56) References Cited

U.S. PATENT DOCUMENTS

| | | | | |
|---|---|---|---|---|
| 5,991,202 A | * | 11/1999 | Derhacobian | ...... G11C 16/0483 365/185.17 |
| 8,144,520 B2 | * | 3/2012 | Kim | ........................ G11C 8/08 365/185.23 |
| 8,320,187 B2 | | 11/2012 | Nagao | |
| 9,230,663 B1 | | 1/2016 | Lu et al. | |
| 9,269,445 B1 | | 2/2016 | Abe et al. | |

(Continued)

FOREIGN PATENT DOCUMENTS

| | | |
|---|---|---|
| JE | 2015-176309 A | 10/2015 |
| JP | 2012-164409 A | 8/2012 |

*Primary Examiner* — Thong Q Le
(74) *Attorney, Agent, or Firm* — Oblon, McClelland, Maier & Neustadt, L.L.P.

(57) ABSTRACT

A semiconductor memory device includes first and second memory transistors and first and second word lines connected to gate electrodes of the memory transistors. The semiconductor memory device is configured such that a first write operation to the first memory transistor, a second write operation to the second memory transistor, a third write operation to the first memory transistor, and a fourth write operation to the second memory transistor are executed in this order. In the first and second write operations, data write is performed using only a program operation. In the third and fourth write operations, data write is performed using the program operation and the verify operation.

16 Claims, 24 Drawing Sheets

(56) References Cited

U.S. PATENT DOCUMENTS

| | | |
|---|---|---|
| 9,343,141 B2 | 5/2016 | Pang et al. |
| 9,396,775 B2 | 7/2016 | Shirakawa et al. |
| 9,437,305 B2 | 9/2016 | Lu et al. |
| 9,595,342 B2 | 3/2017 | Pang et al. |
| 2012/0170363 A1 | 7/2012 | Tsai et al. |

* cited by examiner

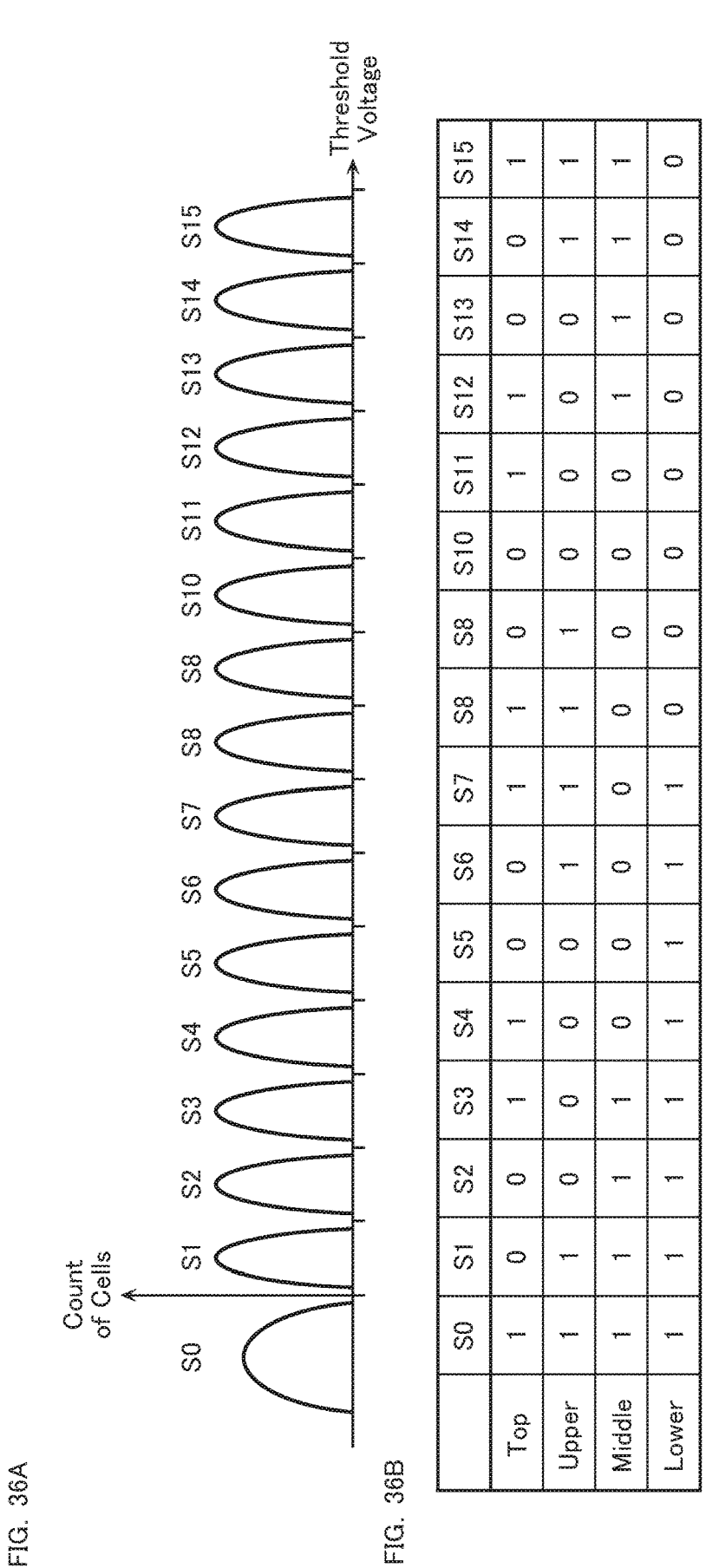

SEMICONDUCTOR MEMORY DEVICE

CROSS-REFERENCE TO RELATED APPLICATIONS

This application is based upon and claims the benefit of Japanese Patent Application No. 2019-033584, filed on Feb. 27, 2019, the entire contents of which are incorporated herein by reference.

BACKGROUND

Field

Embodiments described herein relate generally to a semiconductor memory device.

Description of the Related Art

There has been known a semiconductor memory device that includes a memory string including a plurality of memory transistors.

BRIEF DESCRIPTION OF THE DRAWINGS

FIGS. 36A and 36B are schematic diagrams illustrating a 1-2-4-8 code.

DETAILED DESCRIPTION

Figure 1:
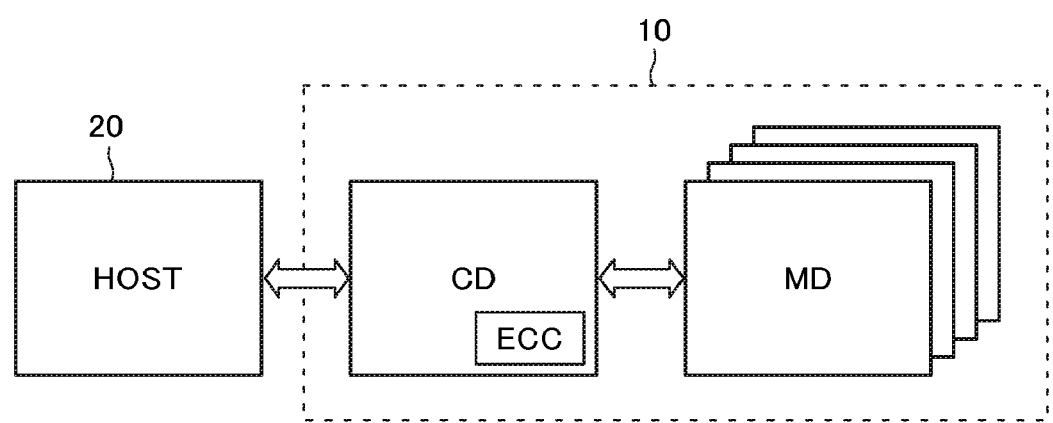
FIG. 1 is a schematic block diagram illustrating a configuration of a memory system 10.

A semiconductor memory device according to one embodiment includes a memory string, a first word line, a second word line, and a controller. The memory string includes a first memory transistor and a second memory transistor. The first memory transistor and the second memory transistor have a plurality of threshold voltages. The first word line is connected to a gate electrode of the first memory transistor. The second word line is connected to a gate electrode of the second memory transistor. The controller performs a write operation and a read operation to the first memory transistor and the second memory transistor. The write operation includes a program operation and a verify operation. The controller executes: a first write operation to write a first threshold voltage to the first memory transistor where data write is performed using only the program operation; a second write operation to write a second threshold voltage to the second memory transistor where data write is performed using only the program operation; a third write operation to write a third threshold voltage to the first memory transistor where data write is performed using the program operation and the verify operation, and the third threshold voltage is higher than the first threshold voltage; and a fourth write operation to write a fourth threshold voltage to the second memory transistor where data write is performed using the program operation and the verify operation, and the fourth threshold voltage is higher than the second threshold voltage. The first to the fourth write operations are executed in this order.

A semiconductor memory device according to one embodiment includes a memory string that includes a first memory transistor and a second memory transistor; a first word line connected to a gate electrode of the first memory transistor; a second word line connected to a gate electrode of the second memory transistor; and a controller connected to the first memory transistor and the second memory transistor, the controller causing the first memory transistor and the second memory transistor to each store data of k bits (k is an integer of 2 or more). The controller executes: a first write operation to supply the first word line with more than one and less than $2^k$ program voltages, the program voltages being different in magnitude, the program voltages being supplied once for each, a second write operation to supply the second word line with more than one and less than $2^k$ program voltages, the program voltages being different in magnitude, the program voltages being supplied once for each, a third write operation to supply the first word line with $2^k$ or more program voltages, the program voltages being different in magnitude, and a fourth write operation to supply the second word line with $2^k$ or more program voltages, the program voltages being different in magnitude. The first to the fourth write operations are executed in this order.

Next, semiconductor memory devices according to embodiments will be described in detail with reference to the accompanying drawings. Here, the following embodiments are only examples, and are not described for the purpose of limiting the present invention.

In this specification, when referring to "the semiconductor memory device", it may mean a memory die or may mean a memory system including a control die, such as a memory chip, a memory card, and an SSD. Further, it may mean a configuration including a host computer such as a smartphone, a tablet terminal, and a personal computer.

In this specification, when referring to that a first configuration "is electrically connected" to a second configuration, the first configuration may be directly connected to the second configuration, or the first configuration may be connected to the second configuration via wiring, a semiconductor member, a transistor, or the like. For example, when three transistors are connected in series, even if the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the first configuration is disposed on a current path between the second configuration and the third configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

[Memory System 10]

FIG. 1 is a schematic block diagram illustrating a configuration of a memory system 10 according to a first embodiment.

The memory system 10, for example, reads, writes, and erases user data corresponding to a signal transmitted from a host computer 20. The memory system 10 is any system configured to store the user data, such as a memory chip, a memory card, and an SSD. The memory system 10 includes a plurality of memory dies MD that store the user data, and a control die CD connected to the plurality of memory dies MD and the host computer 20. The control die CD includes, for example, a processor, a RAM, a ROM, and an ECC circuit, and performs conversion between a logical address and a physical address, bit error detection/correction, wear leveling, and similar process.

Figure 2:
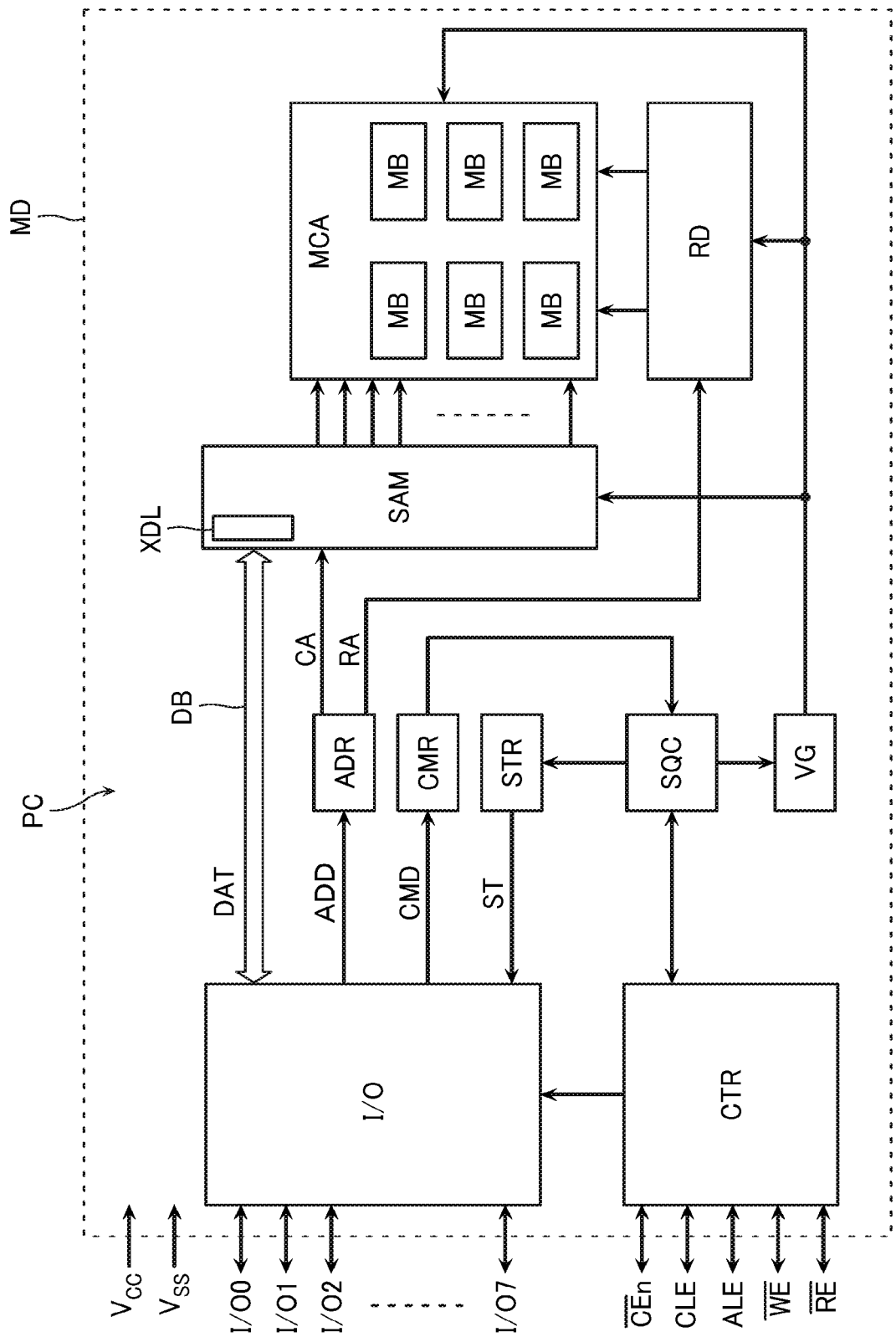
FIG. 2 is a schematic block diagram illustrating a configuration of a memory die MD.
Figure 3:
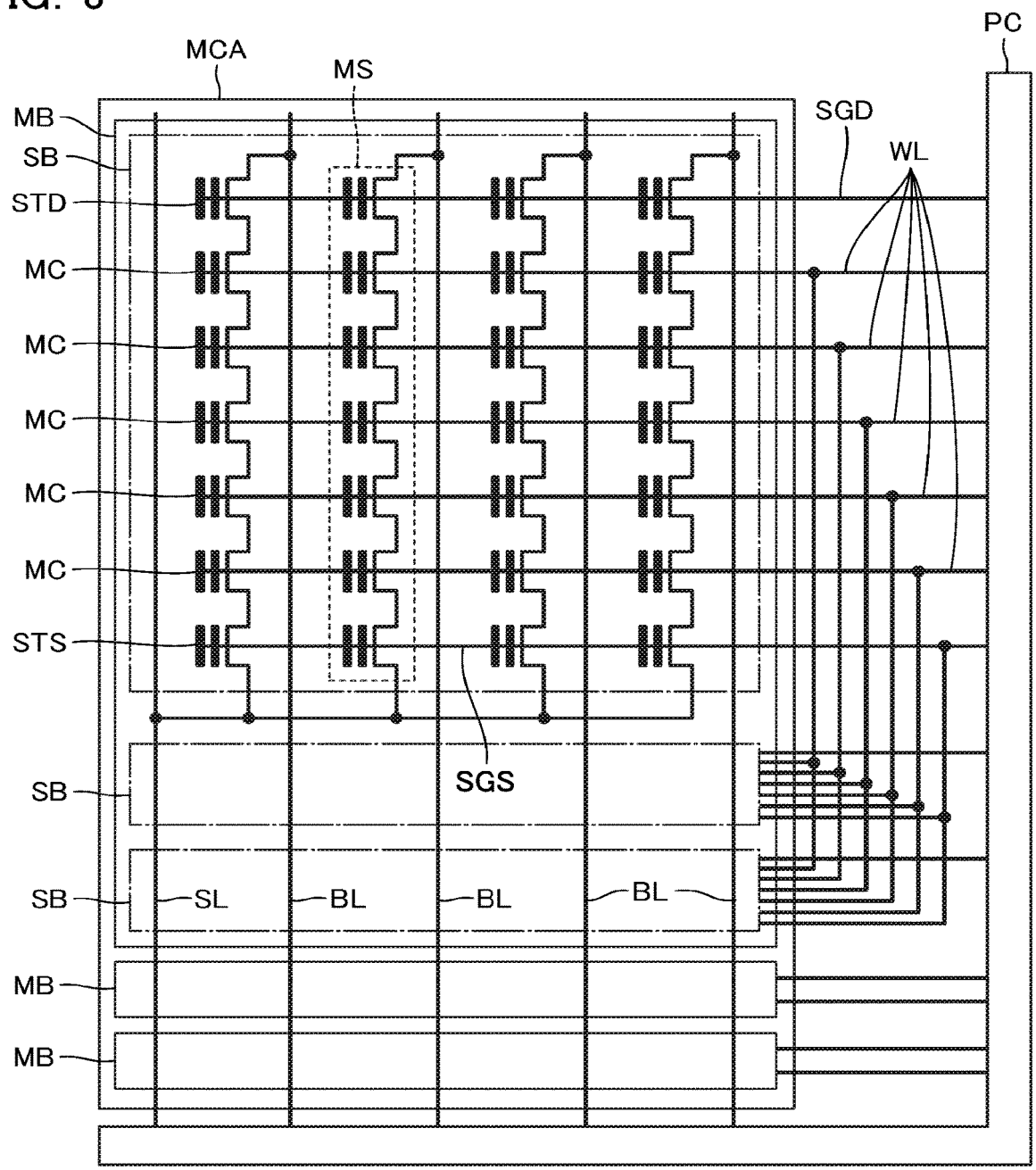
FIG. 3 is a schematic circuit diagram illustrating a configuration of a memory cell array MCA.
Figure 4:
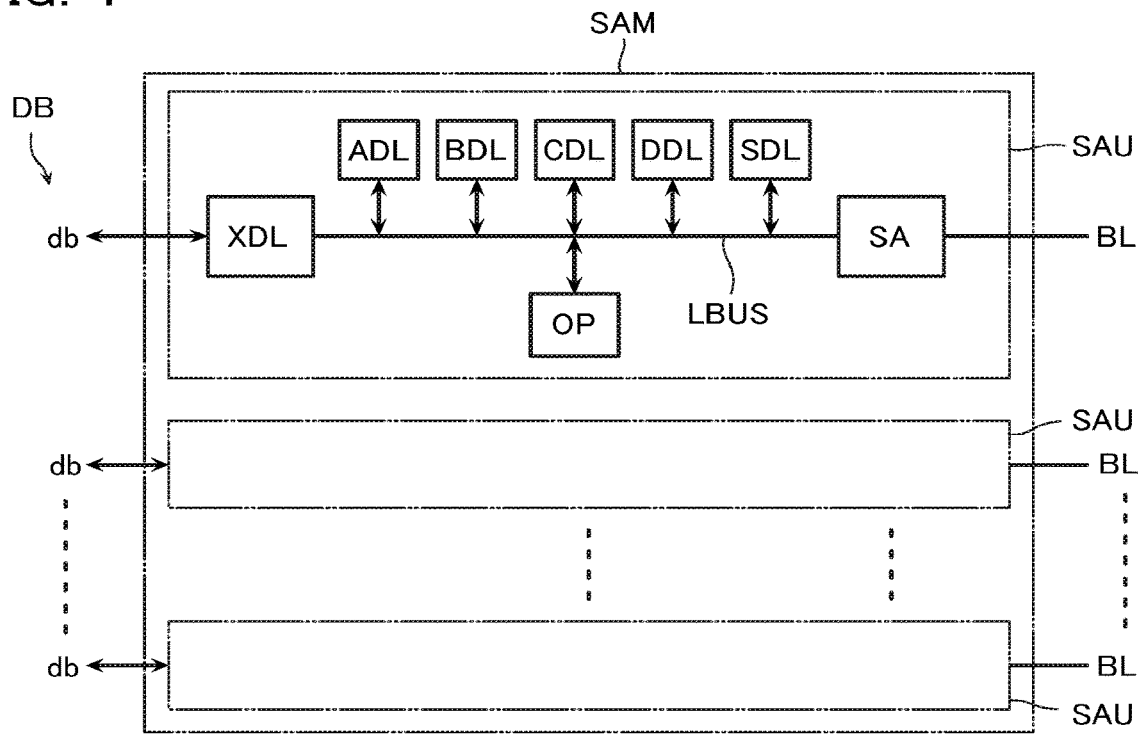
FIG. 4 is a schematic block diagram illustrating a configuration of a sense amplifier module SAM.
Figure 5:
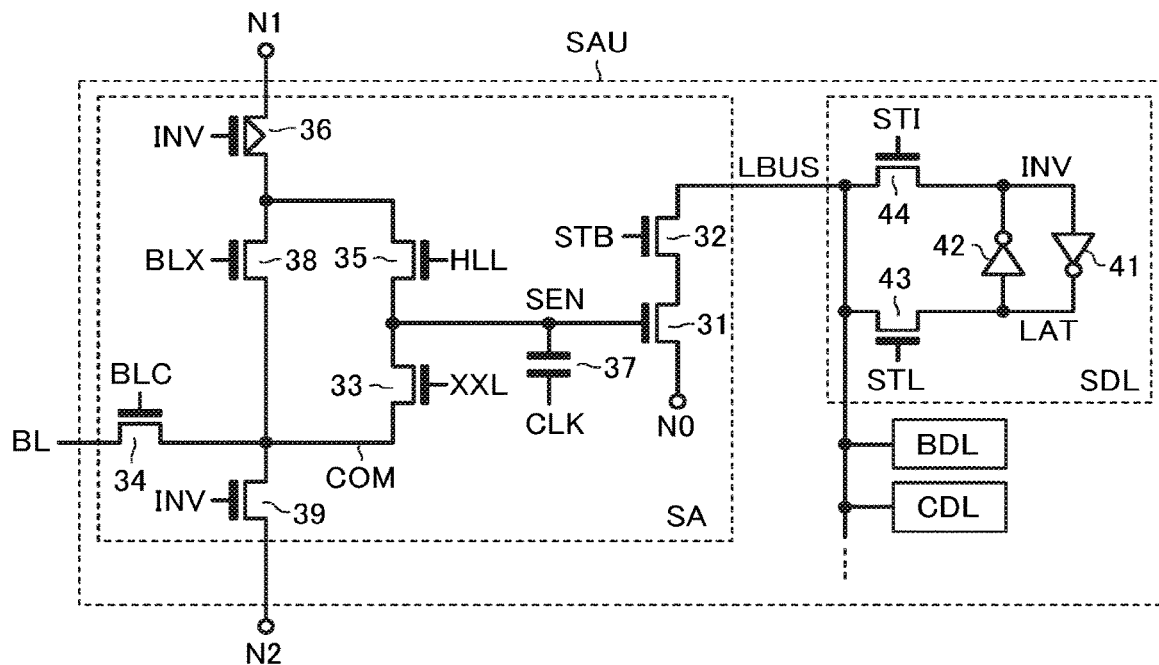
FIG. 5 is a schematic circuit diagram illustrating a configuration of a sense amplifier SA.

FIG. 2 is a schematic block diagram illustrating a configuration of the memory die MD according to the first embodiment. FIG. 3 to FIG. 5 are schematic circuit diagrams illustrating configurations of parts of the memory die MD.

As illustrated in FIG. 2, the memory die MD includes a memory cell array MCA that stores data and a peripheral circuit PC connected to the memory cell array MCA.

[Memory Cell Array MCA]

The memory cell array MCA includes a plurality of memory blocks MB. These plurality of memory blocks MB each include a plurality of subblocks SB as illustrated in FIG. 3. These plurality of subblocks SB each include a plurality of memory strings MS. These plurality of memory strings MS have one ends each connected to the peripheral circuit PC via a bit line BL. These plurality of memory strings MS have other ends each connected to the peripheral circuit PC via a common source line SL.

The memory string MS includes a drain select transistor STD, a plurality of memory cells MC, and a source select transistor STS, which are connected in series between the bit line BL and the source line SL. Hereinafter, the drain select transistor STD and the source select transistor STS may be simply referred to as select transistors (STD, STS).

The memory cell MC according to the embodiment is a field-effect type transistor (memory transistor) including a semiconductor layer that functions as a channel region, a gate insulating film including an electric charge accumulating film, and a gate electrode. The memory cell MC has a threshold voltage that varies corresponding to an electric charge amount in the electric charge accumulating film. The memory cell MC stores data of one bit or a plurality of bits. The respective gate electrodes of the plurality of memory cells MC corresponding to one memory string MS are connected to word lines WL. These respective word lines WL are commonly connected to all the memory strings MS in one memory block MB.

The select transistor (STD, STS) is a field-effect type transistor including a semiconductor layer that functions as a channel region, a gate insulating film, and a gate electrode. The respective gate electrodes of the select transistors (STD, STS) are connected to select gate lines (SGD, SGS). The drain select line SGD is disposed corresponding to the subblock SB and commonly connected to all the memory strings MS in one subblock SB. The source select line SGS is commonly connected to all the memory strings MS in one memory block MB.

[Peripheral Circuit PC]

The peripheral circuit PC as a controller includes, as illustrated in FIG. 2, a row decoder RD, a sense amplifier module SAM, a voltage generation circuit VG, and a sequencer SQC. The peripheral circuit PC includes an address register ADR, a command register CMR, and a status register STR. The peripheral circuit PC includes an input/output control circuit I/O and a logic circuit CTR.

The row decoder RD includes, for example, a decode circuit and a switch circuit. The decode circuit decodes a row address RA held onto the address register ADR. The switch circuit electrically conducts the word line WL and the select gate line (SGD, SGS) corresponding to the row address RA with corresponding voltage supply lines in accordance with an output signal of the decode circuit.

The sense amplifier module SAM includes, as illustrated in FIG. 4, a plurality of sense amplifier units SAU corresponding to a plurality of bit lines BL. The sense amplifier unit SAU includes a sense amplifier SA connected to the bit line BL, data latches SDL, ADL, BDL, CDL, DDL, and XDL, a logic circuit OP, and a wiring LBUS connected to these components.

As illustrated in FIG. 5, the sense amplifier SA includes a sense transistor 31 that discharges electric charge of the wiring LBUS corresponding to a current flowing through the bit line BL. The sense transistor 31 has a source electrode connected to a node N0. A drain electrode is connected to the wiring LBUS via a switch transistor 32. A gate electrode is connected to the bit line BL via a sense node SEN, a discharge transistor 33, a node COM, and a clamp transistor 34. The sense node SEN is connected to a node N1 via a charge transistor 35 and a charge transistor 36, and connected to an internal control signal CLK via a capacitor 37. The node COM is connected to the node N1 via a charge transistor 38 and the charge transistor 36, and connected to a node N2 via a discharge transistor 39.

The sense transistor 31, the switch transistor 32, the discharge transistor 33, the clamp transistor 34, the charge transistor 35, the charge transistor 38, and the discharge transistor 39 are, for example, NMOS transistors. The charge transistor 36 is, for example, a PMOS transistor.

The data latch SDL includes nodes LAT and INV, inverters 41 and 42 connected to the nodes LAT and INV in parallel, a switch transistor 43 connected to the node LAT and the wiring LBUS, and a switch transistor 44 connected to the node INV and the wiring LBUS. The switch transistors 43 and 44 are, for example, NMOS transistors.

To the data latches ADL, BDL, CDL, and DDL (FIG. 4), for example, data included in the data latch SDL is appropriately transferred. The logic circuit OP performs a logical operation such as AND and OR on the data in the data latches ADL, BDL, CDL, and DDL, thus calculating user data allocated to the memory cell MC.

A data latch XDL is connected to the wiring LBUS and a wiring db constituting a bus DB. The data latch XDL stores, for example, the user data written to the memory cell MC or the user data read out from the memory cell MC.

The sense amplifier module SAM includes a decode circuit and a switch circuit (not illustrated). The decode circuit decodes a column address CA held in the address register ADR (FIG. 2). The switch circuit electrically conducts the data latch XDL corresponding to the column address CA with a bus DB, in accordance with an output signal of the decode circuit.

The voltage generation circuit VG (FIG. 2) includes, for example, a step up circuit such as a charge pump circuit connected to a power supply terminal and a grounding terminal, a step down circuit such as a regulator, and a plurality of voltage supply lines (not illustrated). The voltage generation circuit VG generates a plurality of operating voltages supplied to the bit line BL, the source line SL, the word line WL, and the select gate lines (SGD, SGS) to simultaneously output the plurality of operating voltages from a plurality of voltage supply lines, in a read operation, a write operation, and an erase operation for the memory cell array MCA, in response to an internal control signal from the sequencer SQC.

The sequencer SQC sequentially decodes command data CMD held in the command register CMR to output the internal control signal to the row decoder RD, the sense amplifier module SAM, and the voltage generation circuit VG. The sequencer SQC outputs status data indicating own state to the status register STR as necessary. For example, in executing the write operation or the erase operation, information indicative of whether the write operation or the erase operation has been normally ended or not is output as the status data.

The input/output control circuit I/O includes data input/output terminals I/O0 to I/O7, a shift register connected to these data input/output terminals I/O0 to I/O7, and a FIFO buffer connected to this shift register. The input/output control circuit I/O outputs data input from the data input/output terminals I/O0 to I/O7 to the data latch XDL in the sense amplifier module SAM, the address register ADR, or the command register CMR, in accordance with the internal control signal from the logic circuit CTR. The input/output control circuit I/O outputs data input from the data latch XDL or the status register STR to the data input/output terminals I/O0 to I/O7.

The logic circuit CTR receives an external control signal from the control die CD via external control terminals /CEn, CLE, ALE, /WE, and /RE to output the internal control signal to the input/output control circuit I/O in accordance with this.

Figure 6:
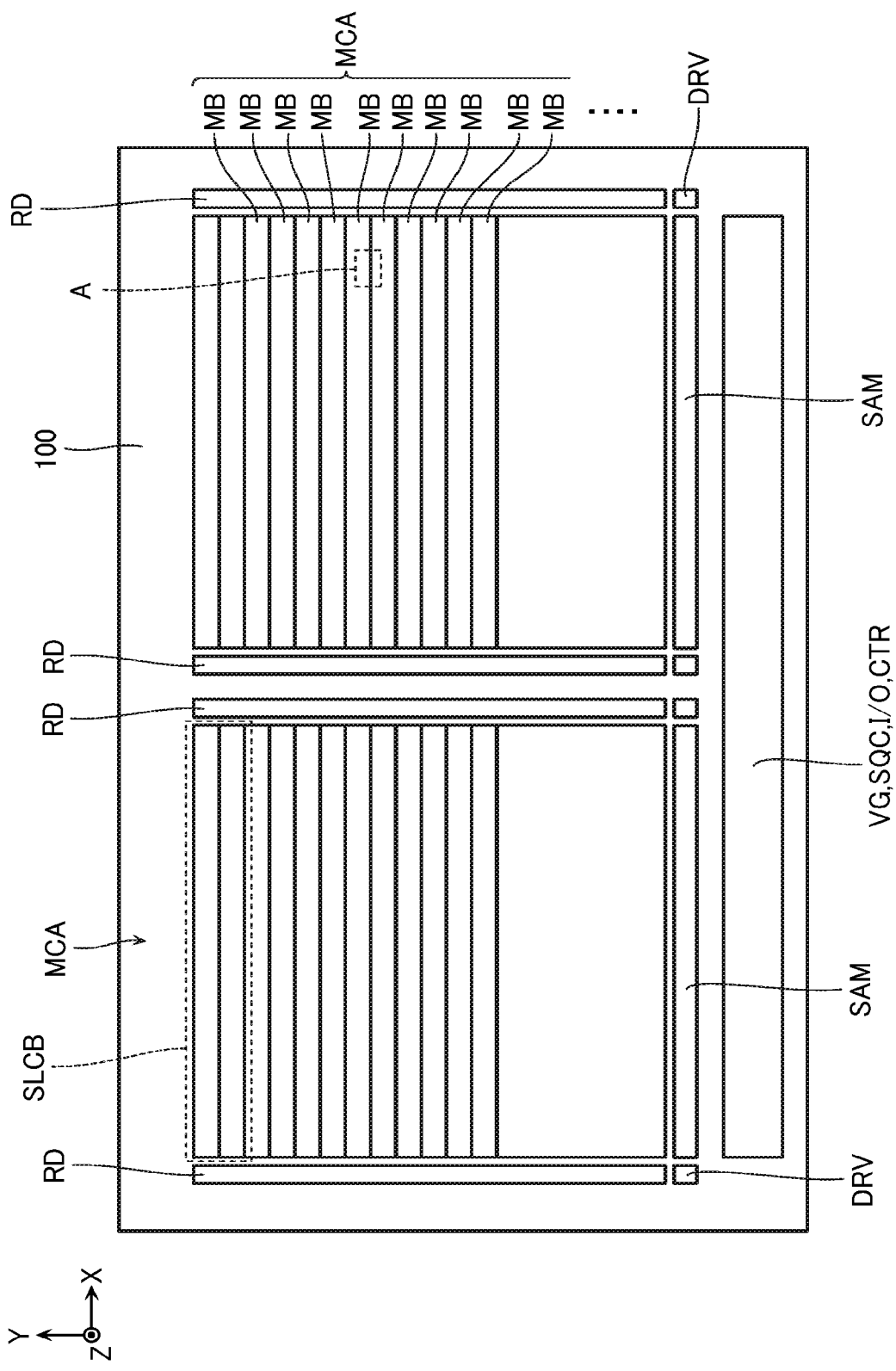
FIG. 6 is a schematic plan view illustrating a configuration of a memory die MD.
Figure 7:
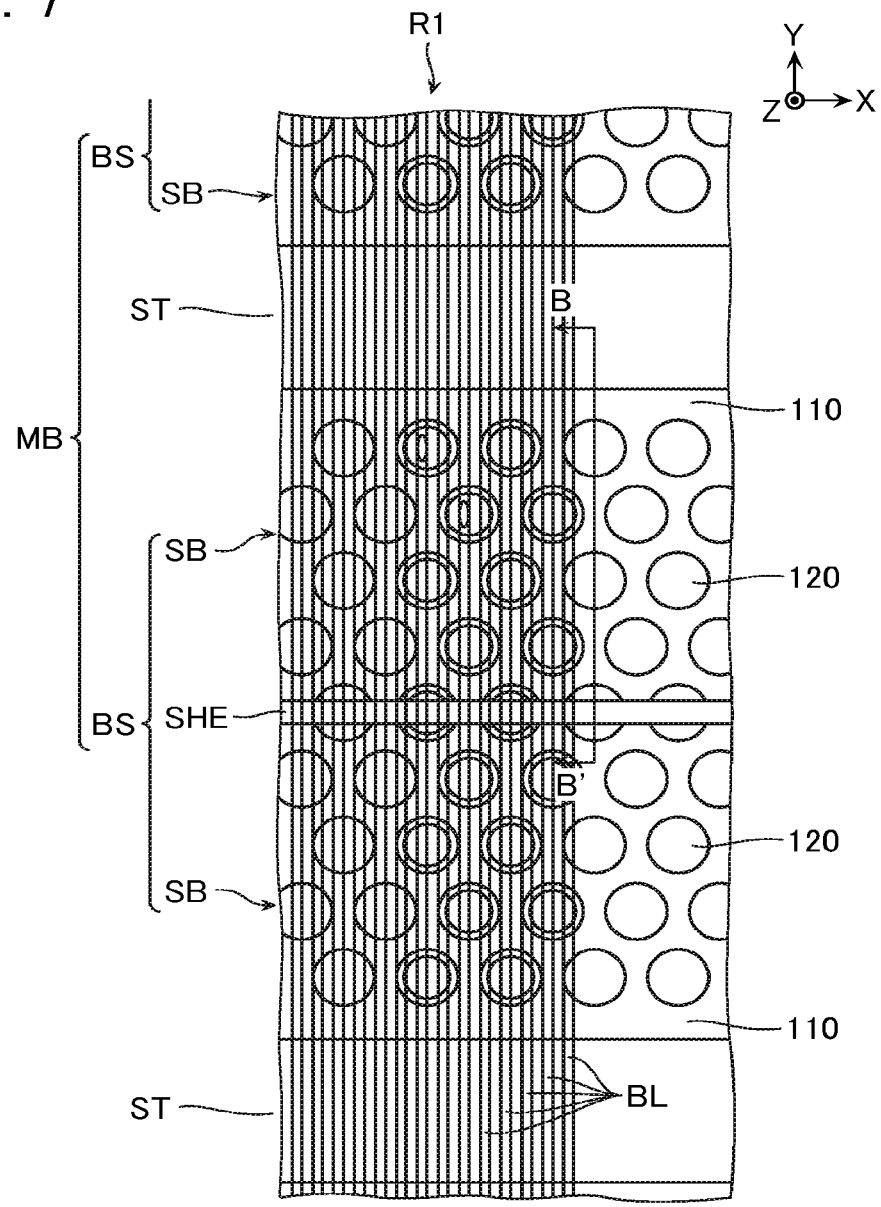
FIG. 7 is a schematic plan view illustrating a configuration of a memory cell array MCA.
Figure 8:
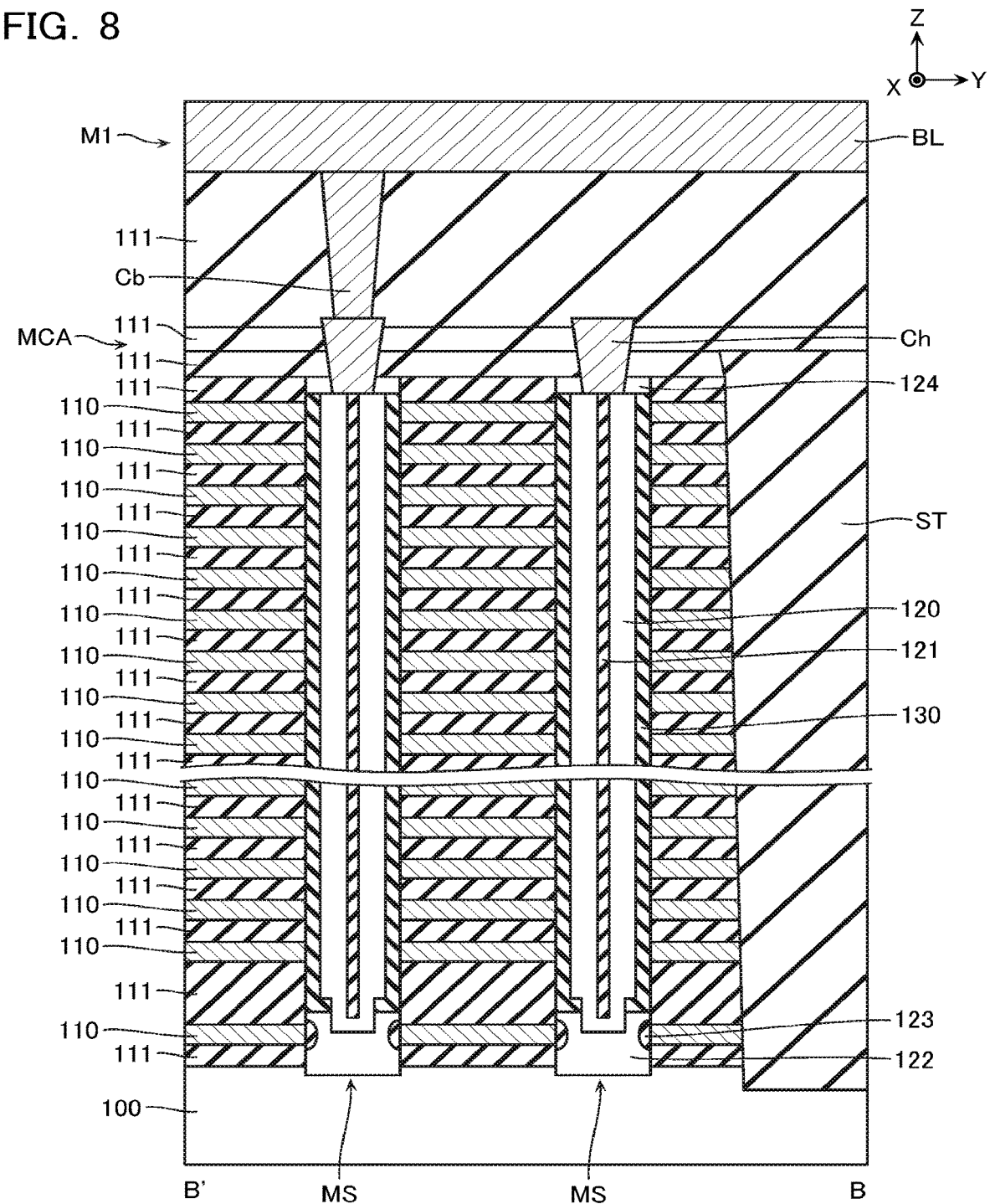
FIG. 8 is a schematic cross-sectional view illustrating the configuration of the memory cell array MCA.
Figure 9:
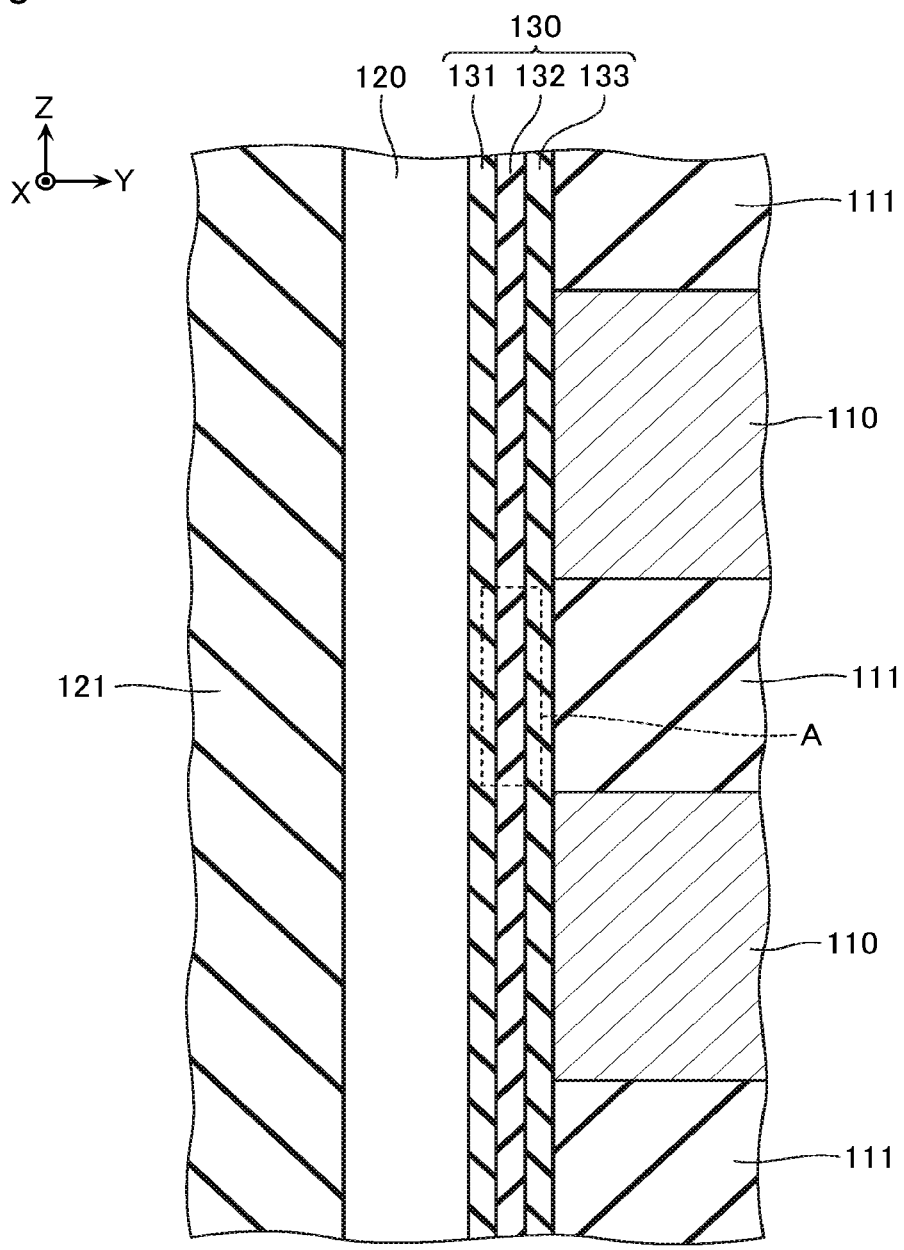
FIG. 9 is a schematic cross-sectional view illustrating a configuration of a memory cell MC.

The following describes an exemplary configuration of a semiconductor memory device according to the embodiment with reference to FIG. 6 to FIG. 9. FIG. 6 is a schematic plan view of the semiconductor memory device according to the embodiment. FIG. 7 is a schematic enlarged view of a part indicated by A in FIG. 6. FIG. 8 is a schematic cross-sectional view taken along a line B-B' of a structure illustrated in FIG. 7 viewed in an arrow direction. FIG. 9 is a schematic enlarged view of FIG. 8. FIG. 6 to FIG. 9 illustrate a schematic configuration. A specific configuration is changeable as necessary. In FIG. 6 to FIG. 9, a part of the configuration is omitted.

As illustrated in FIG. 6, the semiconductor memory device according to the embodiment includes a semiconductor substrate 100. In the example in drawing, the semiconductor substrate 100 includes two memory cell arrays MCA arranged in an X direction. The row decoders RD are disposed in regions extending in a Y direction along both end portions in the X direction of the memory cell arrays MCA. The sense amplifier modules SAM are disposed in regions extending in the X direction along end portions in the Y direction of the memory cell arrays MCA. Driver circuits DRV are disposed in regions near both end portions in the X direction of the regions where the sense amplifier modules SAM are disposed. In a region outside these regions, the voltage generation circuit VG, the sequencer SQC, the input/output control circuit I/O, and the logic circuit CTR are disposed.

The memory cell array MCA includes a plurality of memory blocks MB arranged in the Y direction. In this embodiment, the memory cells MC included in the plurality of memory blocks MB store multivalued data. However, the memory cells MC included in some memory blocks MB store binary data. Such memory cells MC are used as a buffer memory SLCB.

The memory block MB includes two block structures BS arranged in the Y direction as illustrated in FIG. 7. An inter-block insulating layer ST extending in the X direction is disposed between the two block structures BS that are adjacent in the Y direction. The word lines WL included in the two memory blocks MB are electrically insulated via the inter-block insulating layer ST.

The block structure BS includes two subblocks SB arranged in the Y direction and an inter-subblock insulating layer SHE disposed between these two subblocks SB.

The subblock SB includes, as exemplified in FIG. 8, a plurality of conducting layers 110 disposed above the semiconductor substrate 100, a plurality of semiconductor layers 120, and a plurality of gate insulating films 130 disposed between the respective plurality of conducting layers 110 and the plurality of semiconductor layers 120.

The semiconductor substrate 100 is, for example, a semiconductor substrate of single-crystal silicon (Si) or the like containing P-type impurities. An N-type well containing N-type impurities such as phosphorus (P) is disposed on a part of a surface of the semiconductor substrate 100. A P-type well containing P-type impurities such as boron (B) is disposed on a part of a surface of the N-type well.

The conducting layer 110 is an approximately plate-shaped conducting layer extending in the X direction. The plurality of conducting layers 110 are arranged in a Z direction. The conducting layer 110, for example, may include a laminated film or the like of titanium nitride (TiN) and tungsten (W) or may include polycrystalline silicon or the like containing impurities of phosphorus, boron, or the like. An insulating layer 111 of silicon oxide ($SiO_2$) or the like is disposed between the conducting layers 110.

Among the plurality of conducting layers 110, one or a plurality of conducting layers 110 positioned at the bottom function as the source select line SGS (FIG. 3) and the gate electrodes of the plurality of source select transistors STS connected to this source select line SGS. A plurality of conducting layers 110 positioned above this function as the word line WL (FIG. 3) and the gate electrodes of the plurality of memory cells MC (FIG. 3) connected to this word line WL. One or a plurality of conducting layers 110 positioned above this function as the drain select line SGD and the gate electrodes of the plurality of drain select transistors STD (FIG. 3) connected to this drain select line SGD.

The plurality of semiconductor layers 120 are arranged in the X direction and the Y direction as exemplified in FIG. 7. The semiconductor layer 120 is, for example, a semiconductor film of non-doped polycrystalline silicon (Si) or the like. The semiconductor layer 120 has, for example, as exemplified in FIG. 8, an approximately cylindrical shape and includes an insulating film 121 of silicon oxide or the like at a center part. Respective outer peripheral surfaces of the semiconductor layers 120 are surrounded by the conducting layers 110. The semiconductor layer 120 has a lower end portion connected to the P-type well of the semiconductor substrate 100 via a semiconductor layer 122 of non-doped single-crystal silicon or the like. The semiconductor layer 122 is opposed to the conducting layer 110 via an insulating layer 123 of silicon oxide or the like. The semiconductor layer 120 has an upper end portion connected to the bit line BL via a semiconductor layer 124 containing N-type impurities of phosphorus (P) or the like and contacts Ch and Cb. The semiconductor layer 120 each function as a channel region of the plurality of memory cells MC and the drain select transistor STD included in one memory string MS (FIG. 3). The semiconductor layer 122 functions as a channel region of a part of the source select transistor STS.

The gate insulating film 130 includes, for example, as illustrated in FIG. 9, a tunnel insulating film 131, an electric charge accumulating film 132, and a block insulating film 133, which are laminated between the semiconductor layer 120 and the conducting layer 110. The tunnel insulating film 131 and the block insulating film 133 are, for example, insulating films of silicon oxide or the like. The electric charge accumulating film 132 is, for example, a film configured to accumulate the electric charge of silicon nitride (SiN) or the like. The tunnel insulating film 131, the electric charge accumulating film 132, and the block insulating film 133, which have approximately cylindrical shapes, extend in the Z direction along the outer peripheral surface of the semiconductor layer 120.

FIG. 9 illustrates an example that the gate insulating film 130 includes the electric charge accumulating film 132 of silicon nitride or the like. However, the gate insulating film 130 may include, for example, a floating gate of polycrystalline silicon or the like containing N-type or P-type impurities.

[Threshold Voltage of Memory Cell MC]

Next, the threshold voltage of the memory cell MC will be described with reference to FIGS. 10A to 10C. FIG. 10A is a schematic histogram for describing the threshold voltage of the memory cell MC. The horizontal axis indicates a voltage of the word line WL and the vertical axis indicates the number of the memory cells MC. FIG. 10B illustrates an example of the threshold voltage of the memory cell MC and data stored in the memory cell MC. FIG. 10C illustrates another example of the threshold voltage of the memory cell MC and data stored in the memory cell MC.

As described above, the memory cell array MCA includes a plurality of memory cells MC. When the write operation is performed to the plurality of memory cells MC, the threshold voltages of these memory cells MC are controlled in a plurality of states. FIG. 10A illustrates a distribution of the threshold voltages of the memory cells MC controlled in eight states. For example, the threshold voltage of the memory cell MC controlled in a state A is larger than a read voltage $V_{CGAR}$ and a verify voltage $V_{VFYA}$ of FIG. 10A and smaller than a read voltage $V_{CGBR}$ and a verify voltage $V_{VFYB}$. Every threshold voltage of the memory cells MC is smaller than a read pass voltage $V_{READ}$ of FIG. 10A.

In this embodiment, the memory cells MC are adjusted in the eight states, thus storing 3-bit data in each memory cell MC.

For example, a state Er corresponds to a lowest threshold voltage (threshold voltage of the memory cell MC in an erase state). For example, the data "111" is allocated to the memory cell MC corresponding to the state Er.

The state A corresponds to the threshold voltage larger than the threshold voltage corresponding to the state Er. For example, the data "101" is allocated to the memory cell MC corresponding to the state A.

A state B corresponds to the threshold voltage larger than the threshold voltage corresponding to the state A. For example, the data "001" is allocated to the memory cell MC corresponding to the state B.

The same applies to the following, and a state C to a state G in the drawing correspond to the threshold voltages larger than the threshold voltages corresponding to the state B to the state F. For example, the data "011", "010", "110", "100", and "000" is allocated to the memory cells MC corresponding to the distribution of them.

In the case of the allocation as exemplified in FIG. 10B, the data of a low-order bit is distinguishable with one read voltage $V_{CGDR}$, the data of a middle-order bit is distinguishable with three read voltages $V_{CGAR}$, $V_{CGCR}$, and $V_{CGFR}$, and the data of a high-order bit is distinguishable with three read voltages $V_{CGBR}$, $V_{CGER}$, and $V_{CGGR}$. Such an allocation of the data is referred to a 1-3-3 code in some cases.

The number of bits of the data stored in the memory cell MC, the number of states, the allocation of the data to each state, and the like are changeable as necessary.

For example, in the case of the allocation as exemplified in FIG. 10C, the data of the low-order bit is distinguishable with one read voltage $V_{CGDR}$, the data of the middle-order bit is distinguishable with two read voltages $V_{CGBR}$ and $V_{CGFR}$, and the data of the high-order bit is distinguishable with four read voltages $V_{CGAR}$, $V_{CGCR}$, $V_{CGER}$, and $V_{CGGR}$. Such an allocation of the data is referred to a 1-2-4 code in some cases.

[Read Operation]

Figure 10:
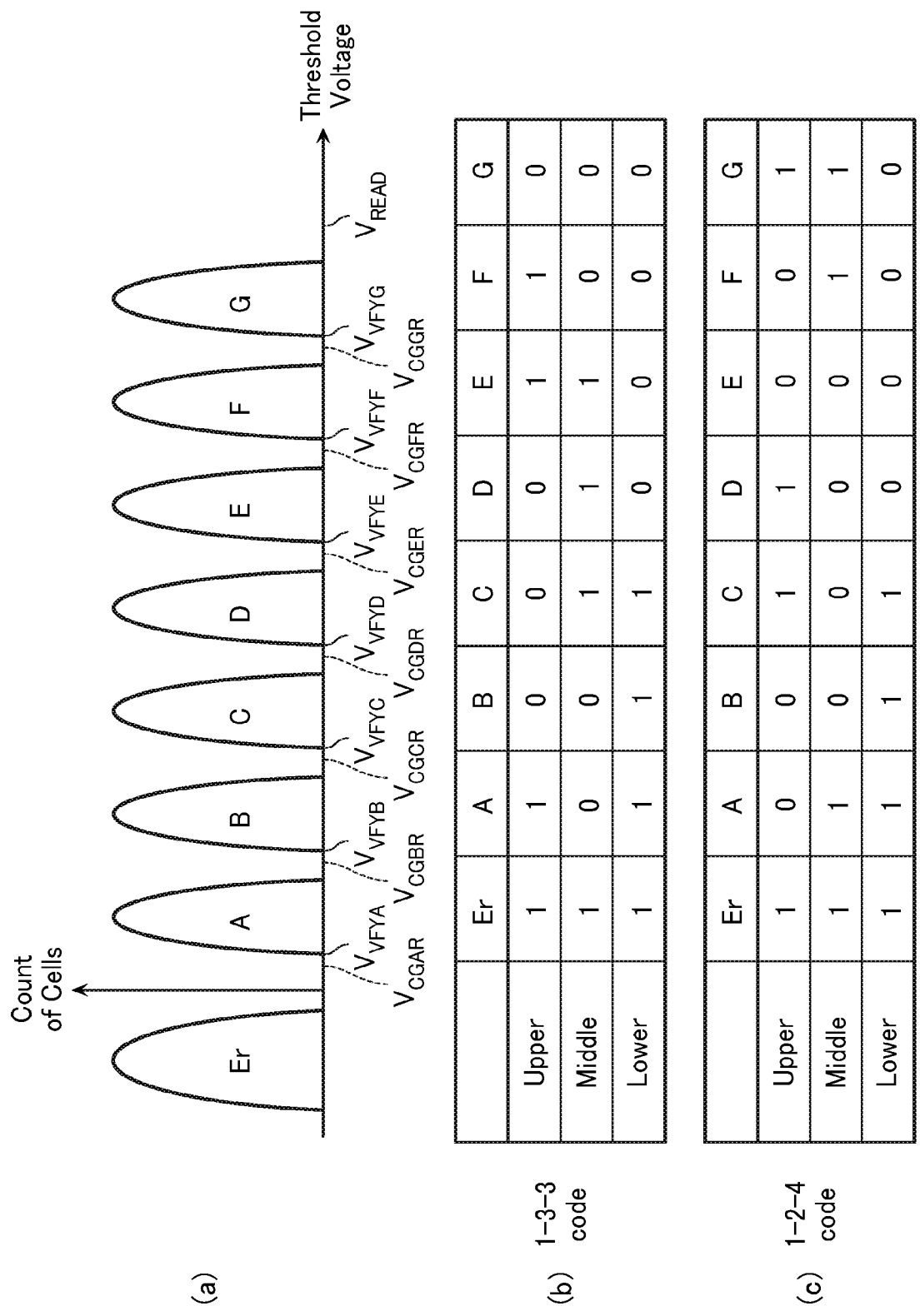
FIGS. 10A to 10C are schematic diagrams for describing data stored in the memory cell MC.
Figure 11:
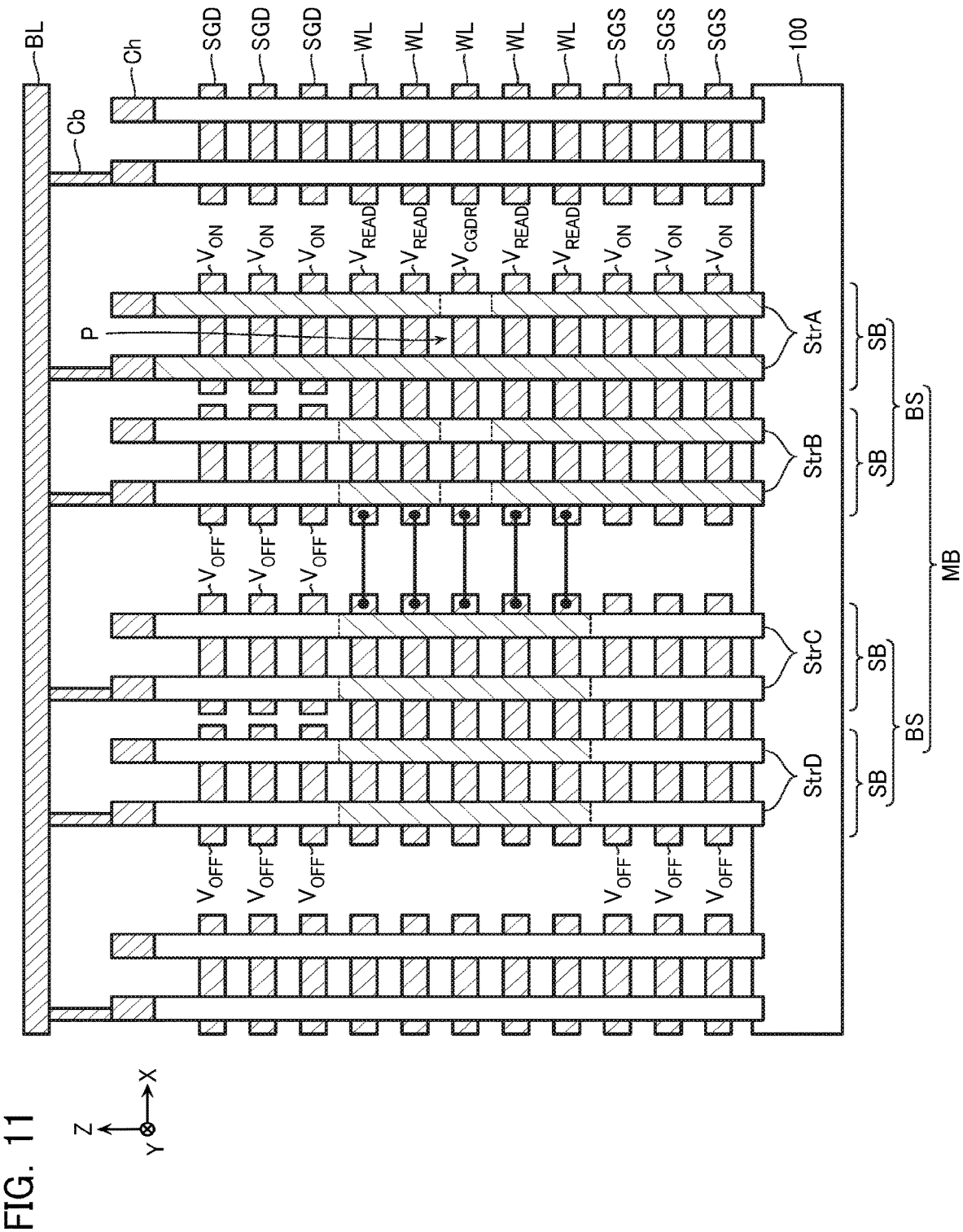
FIG. 11 is a schematic cross-sectional view for describing a read operation.

Next, a description will be given of the read operation of the semiconductor memory device according to the embodiment with reference to FIG. 10A to FIG. 11. FIG. 11 is a schematic cross-sectional view for describing the read operation. The following describes the example where the data is allocated in accordance with the 1-3-3 code of FIG. 10B. In the illustrated example, the memory block MB includes the four subblocks SB. Hereinafter, the respective memory strings MS (FIG. 3) included in these four subblocks SB are referred to as a string StrA, a string StrB, a string StrC, and a string StrD in some cases.

In reading the low-order bit, for example, as illustrated in FIG. 11, a plurality of selected memory cells MC included in a selected page P are selectively electrically conducted with the bit lines BL and the source lines SL. For example, the drain select lines SGD and the source select lines SGS corresponding to the string StrA (selected page P) are supplied with an ON voltage $V_{ON}$ to turn ON the select transistors (STD, STS). Other drain select lines SGD and the source select lines SGS are supplied with an OFF voltage $V_{OFF}$ to turn OFF the select transistors (STD, STS). The non-selected word lines WL corresponding to non-selected pages are supplied with a read pass voltage $V_{READ}$ to turn ON every memory cell MC connected to the non-selected word lines WL.

As illustrated in FIG. 11, the read voltage $V_{CGDR}$ is supplied to the selected word line WL corresponding to the selected page P. This turns the memory cells MC corresponding to the state Er to the state C of FIG. 10A into the ON state, and turns the memory cells MC corresponding to the state D to the state G into the OFF state.

The sense amplifier SA detects the ON state/OFF state of the selected memory cell MC. For example, the wiring LBUS of FIG. 5 is charged and the node STL is turned into an "H" state, thus causing the data latch SDL to latch the "H". The nodes HLL, BLX, and BLC are turned into the "H" state, and the bit line BL and the sense node SEN start to be charged. The node HLL is turned from the "H" state to an "L" state, and the node XXL is turned from the "L" state to the "H" state, thus discharging the electric charge of the sense node SEN to the bit line BL. Here, the voltage of the sense node SEN connected to the bit line BL corresponding to the memory cell MC in the ON state relatively significantly reduces. Meanwhile, the voltage of the sense node SEN connected to the bit line BL corresponding to the memory cell MC in the OFF state does not significantly reduce. Therefore, by turning the node STB into the "H" state at a predetermined timing to discharge or keep the electric charge of the wiring LBUS and turning the node STL into the "H" state again, "L" and "H" are latched to the data latches SDL corresponding to the selected memory cells MC in the ON state and the OFF state, respectively.

Then the data latched to the data latch SDL is output. For example, the data latched to the data latch SDL is transferred to the control die CD via the wiring LBUS, the data latch XDL, the bus DB, and the input/output control circuit I/O. The control die CD transfers this data to the host computer 20 after the bit error detection/correction and the like of this data.

In reading the middle-order bit, for example, the selected memory cell MC is selectively electrically conducted with the bit line BL and the source line SL. Next, for example, the selected word line WL is supplied with the read voltage $V_{CGAR}$ to detect the ON state/OFF state of the selected memory cell MC, and the data of the data latch SDL is transferred to the data latch ADL. Similarly, the selected word line WL is supplied with the read voltage $V_{CGCR}$ to detect the ON state/OFF state of the selected memory cell MC, and the data of the data latch SDL is transferred to the data latch BDL. Similarly, the selected word line WL is supplied with the read voltage $V_{CGFR}$ to detect the ON state/OFF state of the selected memory cell MC, and the data of the data latch SDL is transferred to the data latch CDL. Next, an arithmetic operation such as exclusive OR is performed with the logic circuit OP to calculate the data of the middle-order bit of the selected memory cell MC. Then, the calculated data is output.

In reading the high-order bit, for example, the selected memory cell MC is selectively electrically conducted with the bit line BL and the source line SL. Next, for example, the selected word line WL is supplied with the read voltage $V_{CGBR}$ to detect the ON state/OFF state of the selected memory cell MC, and the data of the data latch SDL is transferred to the data latch ADL. Similarly, the selected word line WL is supplied with the read voltage $V_{CGER}$ to detect the ON state/OFF state of the selected memory cell MC, and the data of the data latch SDL is transferred to the data latch BDL. Similarly, the selected word line WL is supplied with the read voltage $V_{CGGR}$ to detect the ON state/OFF state of the selected memory cell MC, and the data of the data latch SDL is transferred to the data latch CDL. Next, an arithmetic operation such as exclusive OR is performed with the logic circuit OP to calculate the data of the high-order bit of the selected memory cell MC. Then, the calculated data is output.

[Write Operation]

Figure 12:
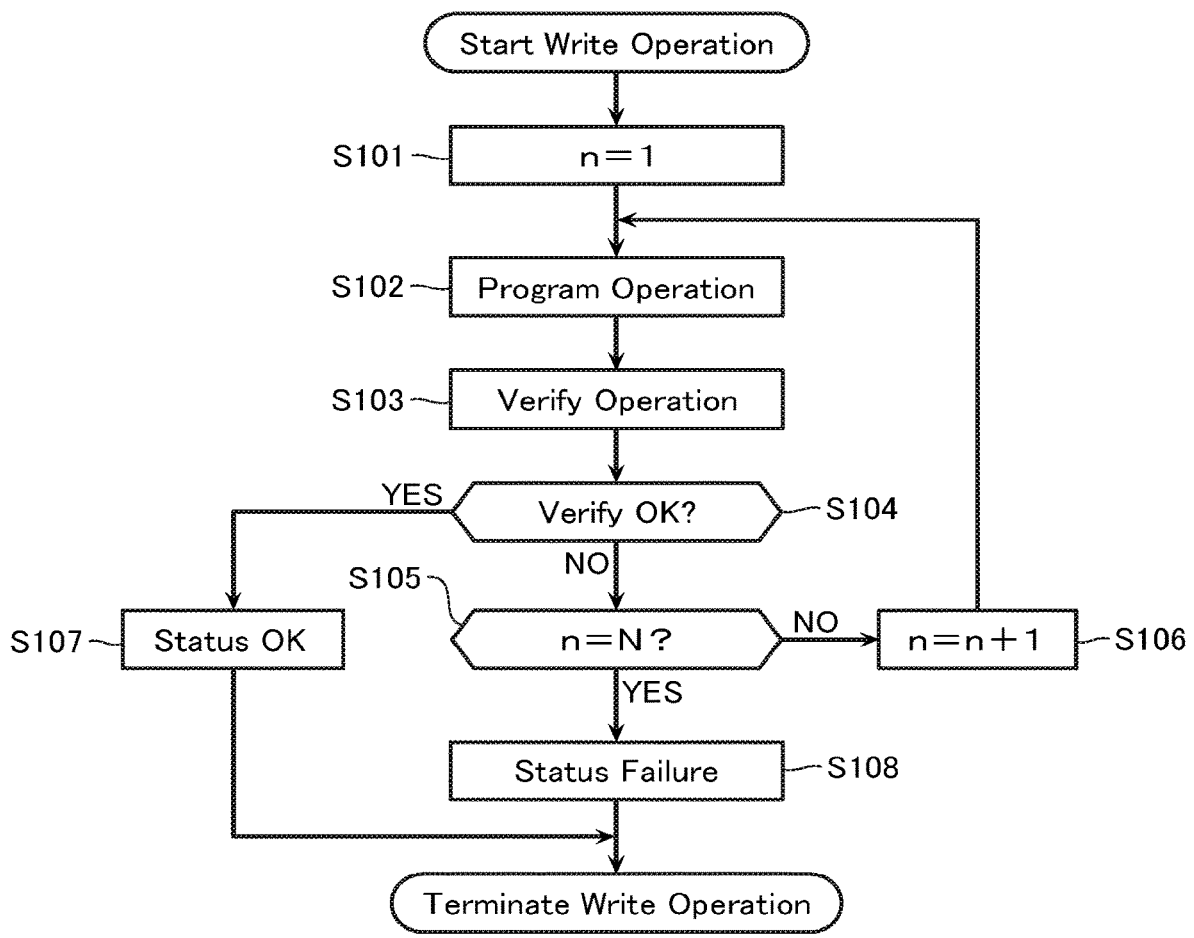
FIG. 12 is a schematic flowchart for describing a write operation.
Figure 13:
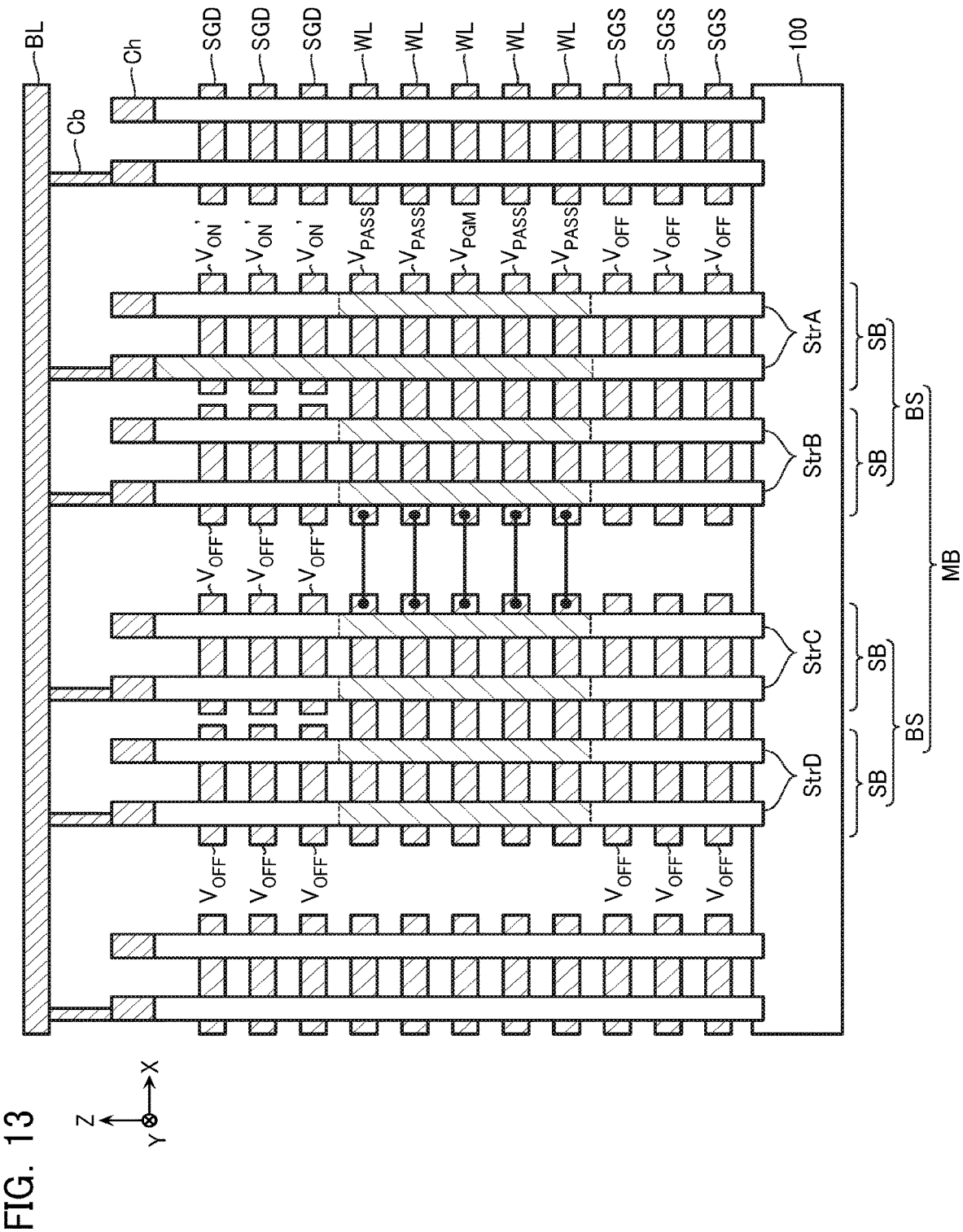
FIG. 13 is a schematic cross-sectional view for describing the write operation.

Next, the write operation of the semiconductor memory device will be described with reference to FIG. 12 and FIG. 13. FIG. 12 is a schematic flowchart for describing the write operation. FIG. 13 is a schematic cross-sectional view for describing the write operation.

In Step S101, a loop count n is set to 1. The loop count n is latched in the register or the like.

In Step S102, a program operation is performed.

In the program operation, for example, the bit line BL connected to the memory cell MC whose threshold value is adjusted and the bit line BL connected to the memory cell MC whose threshold value is not adjusted are supplied with the different voltages. For example, the node LAT of the data latch SDL (FIG. 5) corresponding to the former is set to "H", and the node LAT of the data latch SDL corresponding to the latter is set to "L". The nodes BLX and BLH are set to "H". The bit line BL corresponding to the former is supplied with a ground voltage via the node N0, for example. The bit line BL corresponding to the latter is supplied with a predetermined program inhibit voltage via the node N1, for example.

As illustrated in FIG. 13, the memory cell MC whose threshold voltage is adjusted is selectively electrically conducted with the bit line BL. For example, the drain select line SGD corresponding to the string StrA (selected page P) is supplied with the ON voltage $V_{ON}'$, and other drain select lines SGD are supplied with the OFF voltage $V_{OFF}$. The ON voltage $V_{ON}'$ may be smaller than, for example, the ON voltage $V_{ON}$ of FIG. 11. Thus, the drain select transistor STD corresponding to the bit line BL supplied with the ground voltage turns ON, and the drain select transistor STD corresponding to the bit line BL supplied with the program inhibit voltage turns OFF. The non-selected word lines WL corresponding to non-selected pages are supplied with a write pass voltage $V_{PASS}$. The write pass voltage $V_{PASS}$ may be larger than, for example, the read pass voltage $V_{READ}$ of FIG. 11.

As illustrated in FIG. 13, the selected word line WL is supplied with a program voltage $V_{PGM}$. The program voltage $V_{PGM}$ is larger than the write pass voltage $V_{PASS}$. Thus, the electrons are accumulated on the electric charge accumulating film 132 (FIG. 9) of the desired memory cell MC to increase the threshold voltage of the memory cell MC.

In one program operation, a plurality of program voltages $V_{PGM}$ having mutually different magnitudes may be sequentially supplied to the selected word line WL. For example, when the selected page P includes a plurality of memory cells MC corresponding to the state A to the state G, the selection of the memory cell MC by the voltage adjustment of the bit line BL, the supply of the program voltage $V_{PGM}$ to the selected word line WL, and the adjustment of the program voltage $V_{PGM}$ may be repeated multiple times in one program operation.

In Step S103 (FIG. 12), a verify operation is performed. In the verify operation, for example, similarly to the read operation, the selected memory cell MC is selectively electrically conducted with the bit line BL and the source line SL. Next, for example, the selected word line WL is supplied with the verify voltage $V_{VFYA}$, $V_{VFYB}$, $V_{VFYC}$, $V_{VFYD}$, $V_{VFYE}$, $V_{VFYF}$, or $V_{VFYG}$ (FIG. 10A) to detect the ON state/OFF state of the selected memory cell MC, and the data of the data latch SDL is transferred to the data latch XDL.

In one verify operation, a plurality of verify voltages having mutually different magnitudes may be sequentially supplied to the selected word line WL. For example, when the selected page P includes a plurality of memory cells MC corresponding to the state A to the state G, the selection of the memory cell MC by the voltage adjustment of the bit line BL, the supply of the verify voltage to the selected word line WL, and the selection of the verify voltage may be repeated multiple times in one verify operation.

In Step S104, a result of the verify operation is determined. For example, verify failure is determined when the data held onto the data latch XDL includes "L", and the process proceeds to Step S105. Meanwhile, for example, verify OK is determined when all the data held onto the data latch XDL is "H", and the process proceeds to Step S107.

In Step S105, whether the loop count n has reached a predetermined count Nor not is determined. In the case of not having reached, the process proceeds to Step S106. In the case of having reached, the process proceeds to Step S108.

In Step S106, 1 is added to the loop count n, and the process proceeds to Step S102.

In Step S107, the status data indicating that the write operation has normally terminated is latched in the status register STR (FIG. 2) and output to the control die CD (FIG. 1), and the write operation is terminated.

In Step S108, the status data indicating that the write operation has not normally terminated is latched in the status register STR (FIG. 2) and output to the control die CD (FIG. 1), and the write operation is terminated. In this case, at least one of the host computer 20, the control die CD, and the sequencer SQC classify the selected memory cell MC as a defective cell. For example, at least one of a page address, a block address, and a column address corresponding to the selected memory cell MC is stored. For example, at least one of the host computer 20, the control die CD, and the sequencer SQC may refer to at least one of these stored page address, block address, and column address to inhibit the write operation to the page or the block including the defective cell or inhibit the use of the bit line BL connected to the defective cell. Thus, the write operation includes the program operation and the verify operation.

[Write Sequence]

The write operation of the semiconductor memory device has been described above. The following exemplifies some methods as execution orders of the write operation in the memory block MB. Hereinafter, such methods are referred to as "write sequences" or the like.

[Full Sequence Write]

Figure 14:
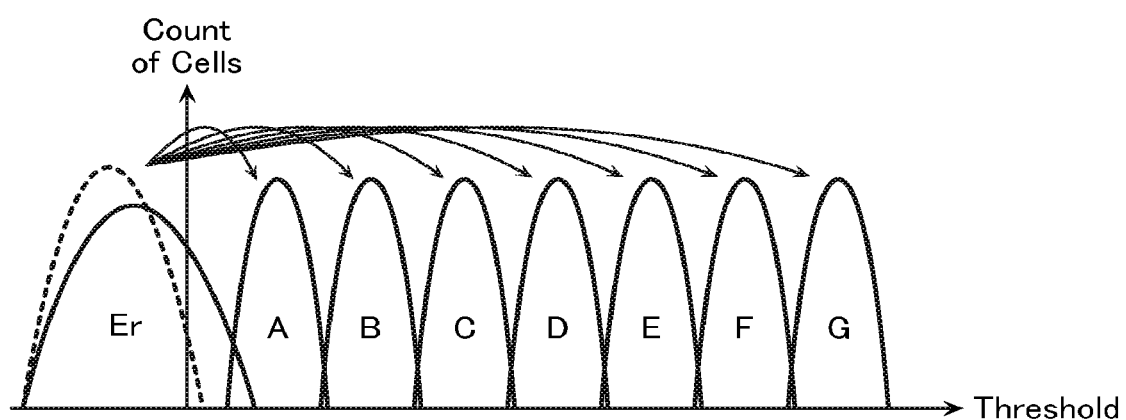
FIG. 14 is a schematic histogram for describing a full sequence write.

FIG. 14 is a schematic histogram for describing one of the write sequences. Hereinafter, the write sequence illustrated in FIG. 14 is referred to as a "full sequence write".

A dotted line in the drawing indicates a distribution of the threshold voltages of the memory cells MC in the page in an erase state. In the page in the erase state, every memory cell MC is controlled in the state Er.

Solid lines in the drawing indicate the distributions of the threshold voltages of the memory cells MC in the page after executing the full sequence write. After the execution of the full sequence write, the memory cells MC are controlled in the eight states.

Figure 15:
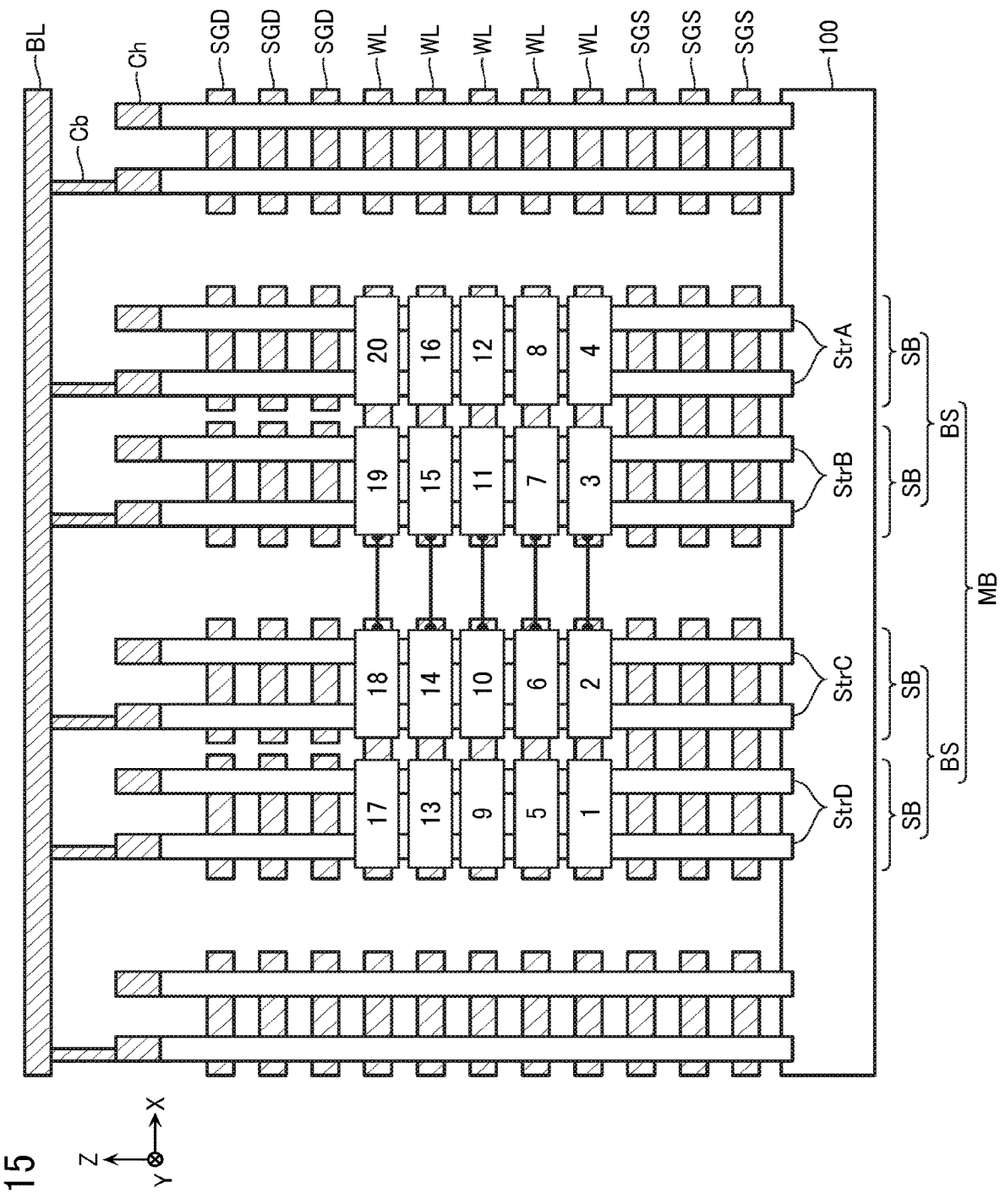
FIG. 15 is a schematic cross-sectional view for describing an order of the write operation in the full sequence write.

FIG. 15 is a schematic drawing illustrating an order of the execution of the write operation in the full sequence write. Numbers illustrated in FIG. 15 indicate the order of the execution of the write operation.

In the example of FIG. 15, as the first to fourth write operations, the write operation is executed to the pages corresponding to the word lines WL of the lowermost layer. Next, as the fifth to eighth write operations, the write operation is executed to the pages corresponding to the word lines WL of the second layer. The same applies to the following, and as the ninth to 20th write operations, the write operation is executed to the pages corresponding to the word lines WL of the third to uppermost layers.

Figure 16:
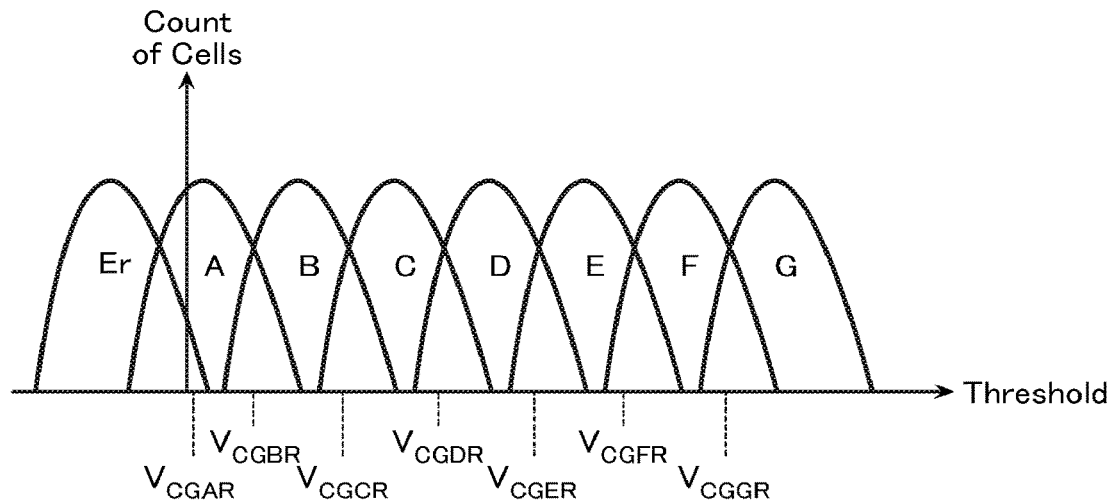
FIG. 16 is a schematic histogram for describing a Neighboring Word Line Interference (NWI)

In this method, for example, as illustrated in FIG. 15, the execution of the fifth write operation corresponding to the string StrD and the word line WL of the second layer possibly expands the distribution of the threshold voltages of the memory cells MC included in the page corresponding to the string StrD and the word line WL of the first layer to which the first write operation is executed as illustrated in FIG. 16, for example. This is considered to be caused because a fringing field generated in the fifth write operation causes the electrons to be injected in a part (the part indicated by A in FIG. 9) of the electric charge accumulating film 132 positioned between the word lines WL. Hereinafter, this phenomenon is referred to as Neighboring Word Line Interference (NWI).

The expansion of the distribution of the threshold voltages of the memory cells MC possibly increases the bit error such that, for example, as exemplified in FIG. 9, the threshold voltage of the memory cell MC controlled in the state A becomes larger than the read voltage $V_{CGBR}$ to be read as the state B. When the bit error rate becomes a certain rate or more, the bit error detection/correction in the control die CD (FIG. 1) becomes hard, and the data possibly fails to be normally read.

The more the distance between the word lines decreases, the more significantly the NWI occurs. However, the distance between the word lines WL adjacent in the Z direction tends to decrease in accordance with high integration of the semiconductor memory device.

[Foggy Fine Write]

Figure 17:
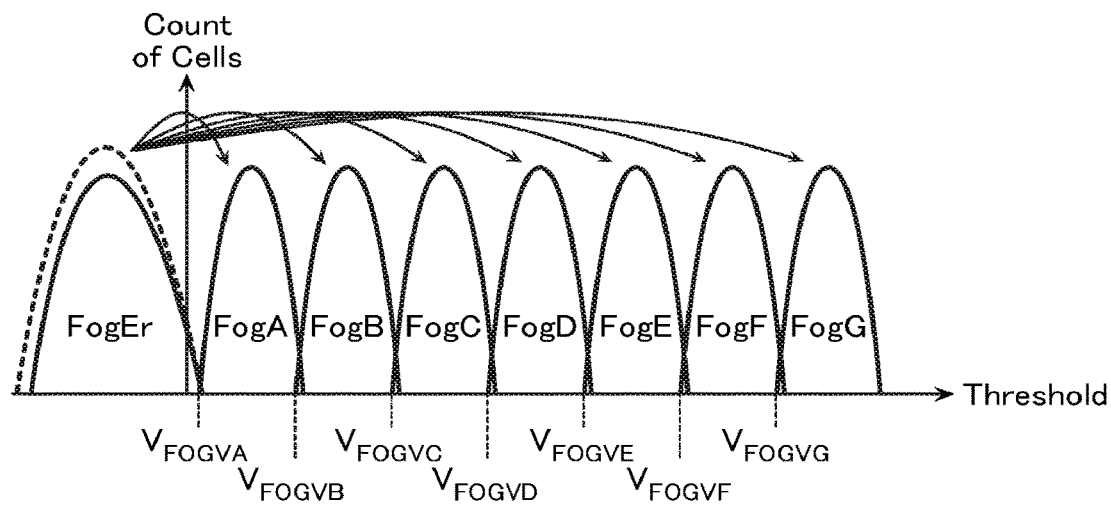
FIG. 17 is a schematic histogram for describing a foggy fine write.
Figure 18:
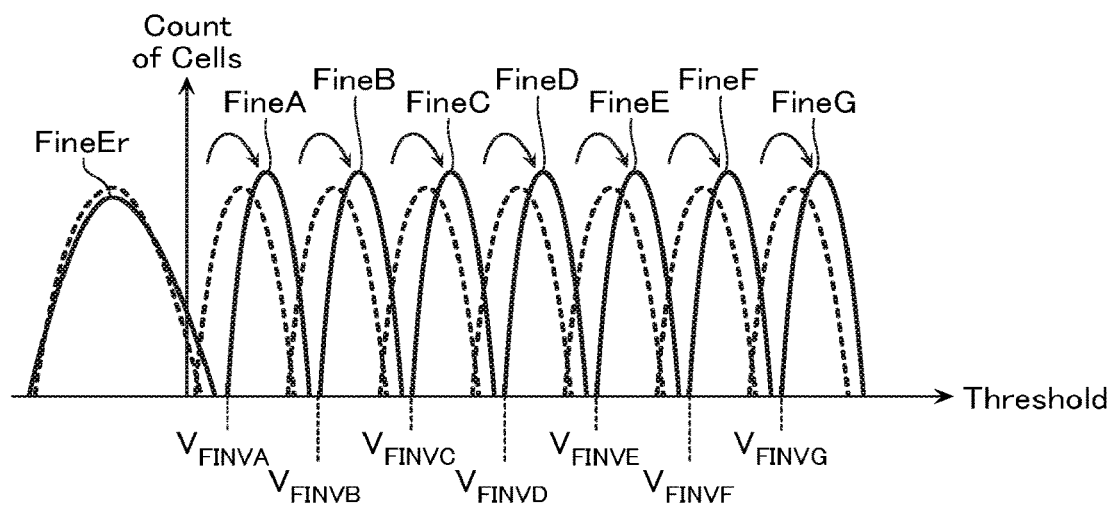
FIG. 18 is a schematic histogram for describing the foggy fine write.

FIG. 17 and FIG. 18 are schematic histograms for describing another write sequence. Hereinafter, the write sequence illustrated in FIG. 17 and FIG. 18 is referred to as a "foggy fine write".

To reduce the influence of the NWI, in the foggy fine write, the control of the threshold voltage of the memory cell MC is executed in divided two stages of a "foggy write operation" and a "fine write operation". As illustrated in FIG. 17, the foggy write operation performs the control such that the threshold voltage of the memory cell MC becomes smaller than the magnitude of a final target threshold voltage. For example, the voltage supplied to the selected memory cell MC in the verify operation (Step S103 of FIG. 12) is set to be lower than the ordinary verify voltage. As illustrated in FIG. 18, the fine write operation more accurately controls the threshold voltage of the memory cell MC.

In FIG. 17, the threshold distributions of the memory cells MC corresponding to the state Er to the state G after the execution of the foggy write are indicated as FogEr to FogG, respectively. Similarly, the threshold distributions of the memory cells MC corresponding to the state Er to the state G after the execution of the fine write are indicated as FineEr to FineG, respectively.

Hereinafter, the verify voltages $V_{VFYA}$ to $V_{VFYG}$ in the verify operation of the foggy write operation are notated as foggy verify voltages $V_{FOGVA}$ to $V_{FOGVG}$ and the like in some cases. The verify voltages $V_{VFYA}$ to $V_{VFYG}$ in the verify operation of the fine write operation are notated as fine verify voltages $V_{FINVA}$ to $V_{FINVG}$ and the like in some cases. The foggy verify voltages $V_{FOGVA}$ to $V_{FOGVG}$ are smaller than the fine verify voltages $V_{FINVA}$ to $V_{FINVG}$, respectively. The fine verify voltages $V_{FINVA}$ to $V_{FINVG}$ have magnitudes similar to the verify voltages $V_{VFYA}$ to $V_{VFYG}$ used in the full sequence write and the like, respectively.

Figure 19:
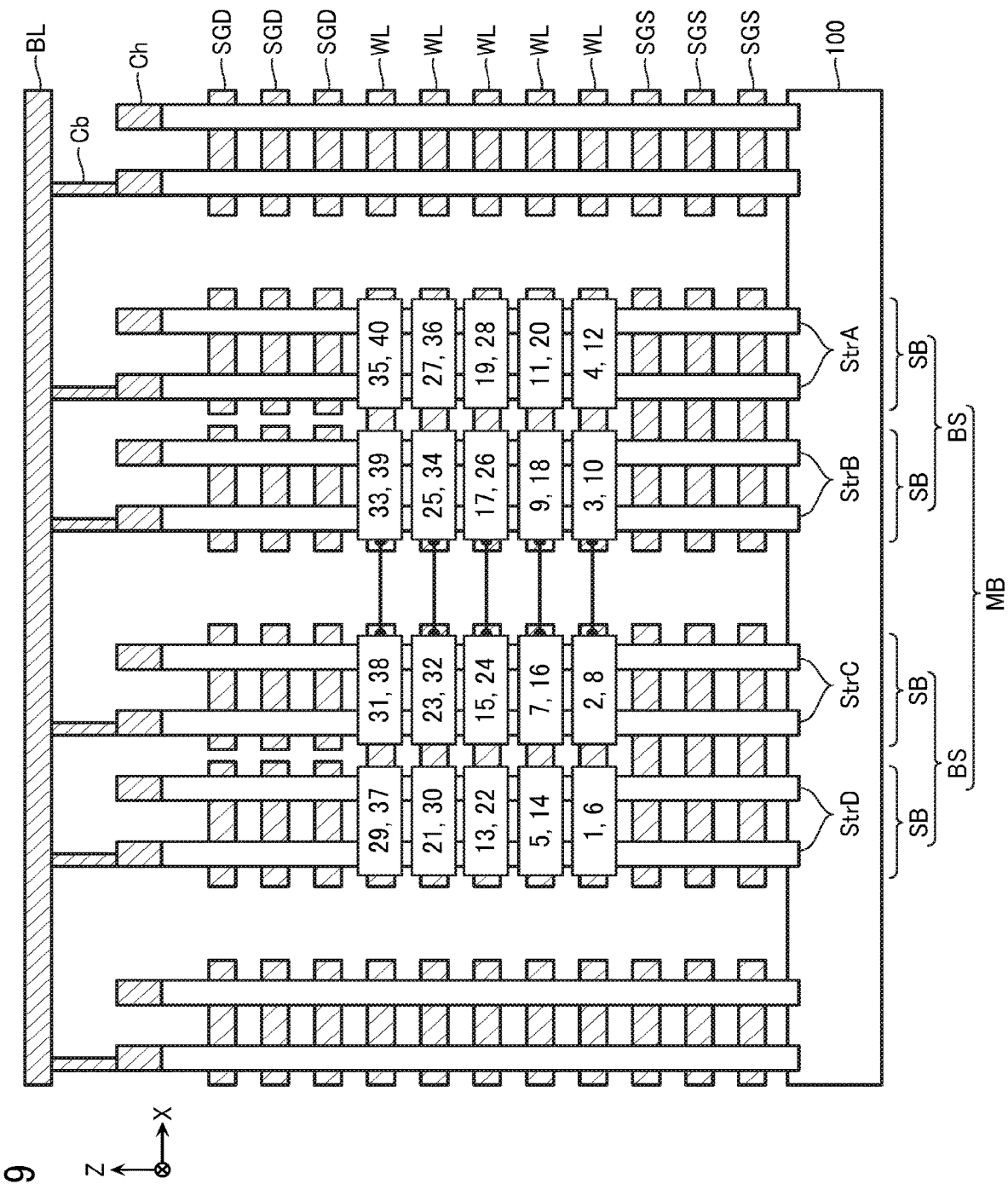
FIG. 19 is a schematic cross-sectional view for describing an order of a write operation in the foggy fine write.

FIG. 19 is a schematic drawing illustrating an order of the execution of the foggy write operation and the fine write operation. Numbers illustrated in FIG. 19 indicate the order of the execution of the write operations.

In the example of FIG. 19, as the first to fourth write operations, the foggy write operation is executed to the pages corresponding to the word lines WL of the lowermost layer. Next, as the fifth to 12th write operations, the foggy write operation to the pages corresponding to the word lines WL of the second layer and the fine write operation to the pages corresponding to the word lines WL of the first layer are alternately executed. Similarly, as the 13th to 36th write operations, the foggy write operation to the pages corresponding to the word lines WL of the third to uppermost layers and the fine write operation to the pages corresponding to the word lines WL of the second layer to the layer one below the uppermost layer are alternately executed. Then, as the 37th to 40th write operations, the fine write operation to the pages corresponding to the word lines WL of the uppermost layer is executed.

In this method, for example, the execution of the fifth foggy write operation corresponding to the string StrD and the word line WL of the second layer causes the influence of the NWI on the page corresponding to the string StrD and the word line WL of the first layer to which the first foggy write operation is executed. However, in the first foggy write operation, the threshold voltage of the memory cell MC is controlled in the magnitude lower than the final magnitude. Thus, even if the influence of the NWI is caused, significant excess of the final threshold voltage to an allowable range can be reduced. Accordingly, the execution of the sixth fine write operation after the termination of the fifth foggy write operation ensures substantial reduction of the influence of the NWI caused by the fifth foggy write operation.

In this method, for example, the execution of the 14th fine write operation corresponding to the string StrD and the word line WL of the second layer causes the influence of the NWI on the page corresponding to the string StrD and the word line WL of the first layer to which the sixth fine write operation is executed. However, the foggy write operation has been already performed to the page to which the 14th fine write operation is executed. Thus, the magnitude or an application time of the program voltage $V_{PGM}$ supplied to the word line WL in the 14th fine write operation is small compared with the write operation in the full sequence write. Accordingly, the influence of the NWI on the page to which the sixth fine write operation is executed can be substantially reduced compared with the case of the full sequence write.

As described above, with the foggy fine write, the influence of the NWI can be substantially reduced compared with the full sequence write.

However, since the foggy fine write includes more steps compared with the full sequence write, speed-up of the process is difficult in some cases.

In the full sequence write, obtaining the data corresponding to the low-order bit, the middle-order bit, and the high-order bit allows the execution of the write operation, and the read operation becomes executable after the execution of the write operation. Meanwhile, in the foggy fine write, the read operation does not become executable until the fine write operation is executed. In the example of FIG. 19, the fine write operation does not become executable until the foggy write operation corresponding to the fifth write operation is executed. Therefore, all the data input so far needs to be written to the buffer memory SLCB (FIG. 6) or the like. This causes an increase in area of the buffer memory SLCB or the like in some cases.

[Two-Stage Write]

Figure 20:
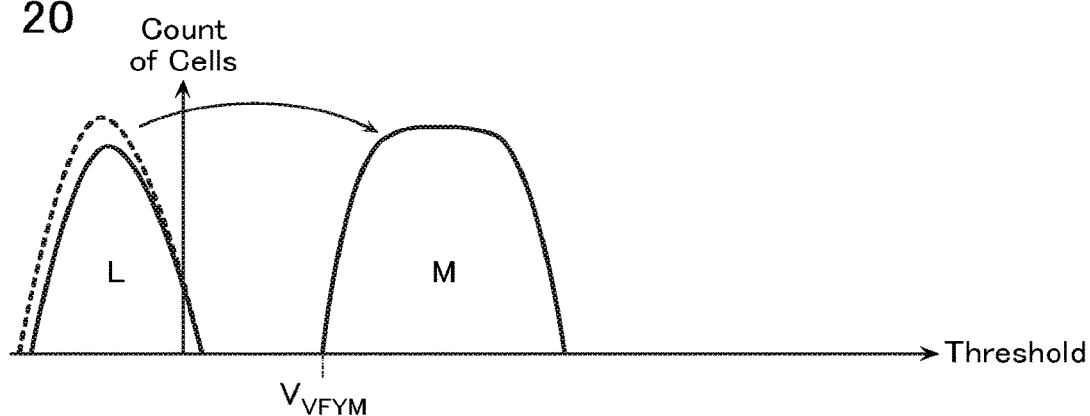
FIG. 20 is a schematic histogram for describing a two-stage write.
Figure 21:
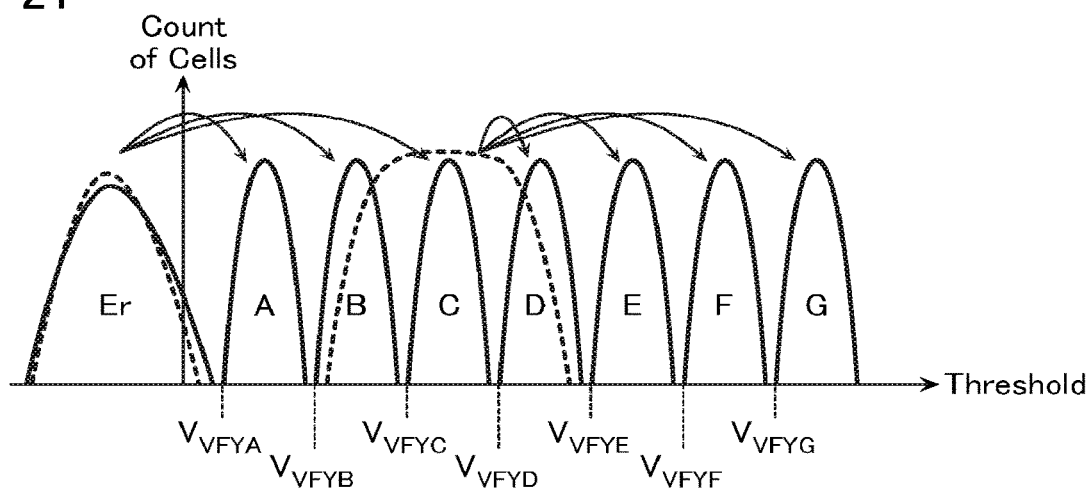
FIG. 21 is a schematic histogram for describing the two-stage write.

FIG. 20 and FIG. 21 are schematic histograms for describing another write sequence. Hereinafter, the write sequence illustrated in FIG. 20 and FIG. 21 is referred to as a "two-stage write".

To reduce the influence of the NWI, in the two-stage write, the control of the threshold voltage of the memory cell MC is executed in divided two stages of a "first-stage write operation" and a "second-stage write operation". As illustrated in FIG. 20, in the first-stage write operation, the memory cells MC corresponding to lower states (state Er to state C of FIGS. 10A to 10C) are controlled to an L state, and the memory cells MC corresponding to upper states (state D to state G of FIGS. 10A to 10C) are controlled to an M state. For example, the voltage supplied to the selected memory cell MC in the verify operation (Step S103 of FIG. 12) is set to a predetermined verify voltage $V_{VFYM}$ smaller than the verify voltage $V_{VFYD}$, and the write operation is executed to the memory cells MC corresponding to the upper states. As illustrated in FIG. 21, the second-stage write operation more accurately controls the threshold voltage of the memory cell MC. The verify voltages $V_{VFYA}$ to $V_{VFYG}$ in the second-stage write operation have magnitudes similar to the verify voltages $V_{VFYA}$ to $V_{VFYG}$ used in the full sequence write and the like, respectively.

The two-stage write is executed, for example, in the order similar to that of the foggy fine write as illustrated in FIG. 19.

The two-stage write ensures significant speed-up compared with the foggy fine write. This is because the first-stage write operation controls the threshold voltage of the memory cell MC in only two patterns, while the foggy write operation controls the threshold voltage of the memory cell MC in eight patterns.

However, the first-stage write operation performs the control such that the threshold voltages of the memory cells MC corresponding to the upper states become smaller than the read voltage $V_{CGER}$ (FIGS. 10A to 10C). This is because the memory cells MC corresponding to the upper states include the memory cell MC corresponding to the state D. Therefore, in the second-stage write operation, the threshold voltage of the memory cell MC corresponding to the state G needs to be controlled in the magnitude of the read voltage $V_{CGER}$ or less to the verify voltage $V_{VFYG}$ or more. Then, the magnitude or the application time of the program voltage $V_{PGM}$ supplied to the word line WL in the second-stage write operation becomes large compared with the fine write operation. Accordingly, for example, the execution of the second-stage write operation as the 14th write operation of FIG. 19 possibly causes the relatively large influence of the NWI in the memory cell MC where the second-stage write operation is executed as the sixth write operation.

[Fast Foggy Fine Write]

Figure 22A:
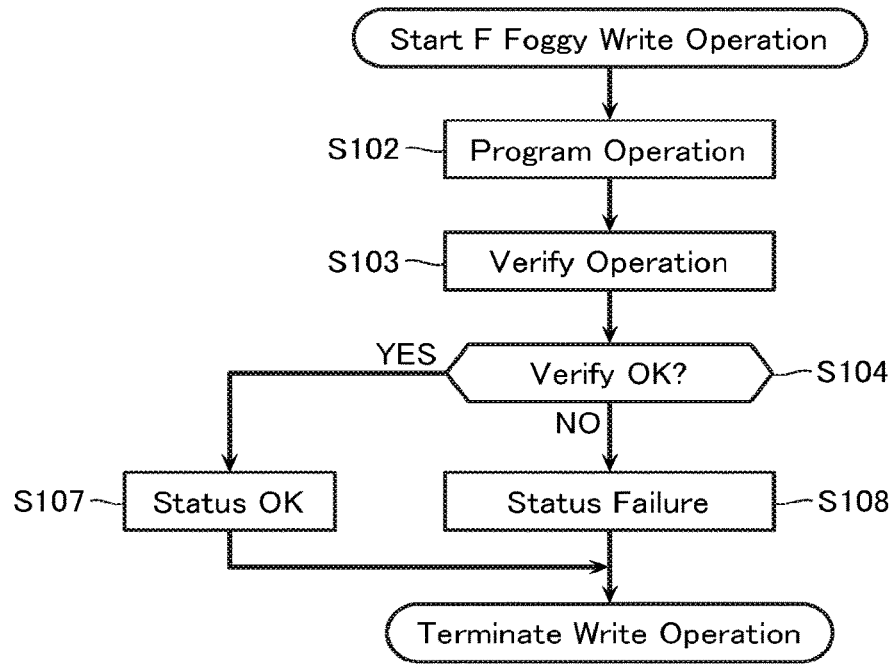
FIG. 22A is a schematic flowchart for describing a fast foggy fine write.

FIG. 22A is a schematic flowchart for describing another write sequence. The write sequence described below is referred to as a "fast foggy fine write".

To reduce the influence of the NWI, in the fast foggy fine write, the control of the threshold voltage of the memory cell MC is executed in divided two stages of a "fast foggy write operation" and the "fine write operation".

In the fast foggy write operation, the write is completed such that threshold voltages of the memory cells MC of the write target are controlled to the target threshold voltages in one program operation without the verify operation. In other words, in the fast foggy write operation, the write to the memory cell MC of the write target is performed using only the program operation. The verify operation may be performed only once for the confirmation after the target threshold voltage is written to the memory cell MC of the write target, in some cases. This verify operation is not used for the write to the memory cell MC of the write target.

In the fast foggy write operation, different from the write operation described with reference to FIG. 12, the program operation is executed only once and the verify operation is executed only once or less even in the case of verify failure as illustrated in FIG. 22A. Therefore, Steps S101, S105, and S106 relating to the setting and the determination of the loop count n are not included, and the process proceeds to Step S108 in the case of verify failure. For example, in the case of verify failure, an additional write is not performed and this memory cell MC is determined to be the defective cell.

The fast foggy write operation performs the control such that, for example, as illustrated in FIG. 17, the magnitude of the target threshold voltage of the memory cell MC is lower than the magnitude of the final target threshold voltage. For example, the program voltage is adjusted such that the target threshold voltage in the foggy write can be written. The following describes the example of the order in the foggy write of the state C to a certain selected memory cell MC.

Figure 22B:
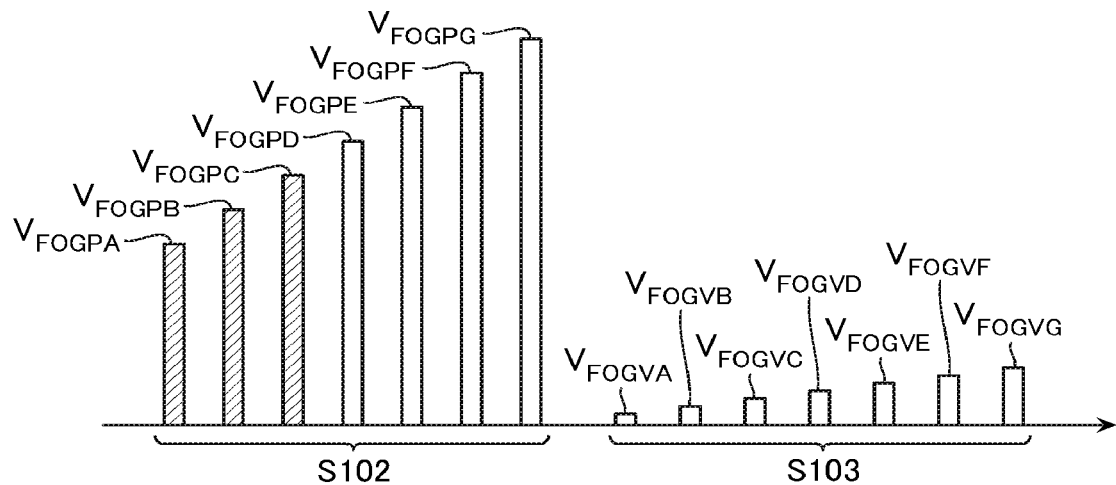
FIG. 22B is a schematic waveform diagram for describing the fast foggy fine write.

In Step S102 of the fast foggy write operation, for example, as illustrated in FIG. 22B, the program voltage $V_{FOGPA}$ corresponding to the state A to the program voltage $V_{FOGPG}$ corresponding to the state G are sequentially supplied to the selected word line WL. To the memory cell MC corresponding to the state C, first, the program voltage $V_{FOGPA}$ for the foggy write of the state A is supplied to perform the foggy write of the state A, and subsequently, the program voltage $V_{FOGPA}$ for the foggy write of the state B is supplied to perform the foggy write of the state B. Finally, the program voltage $V_{FOGPC}$ for the foggy write of the state C is supplied to perform the foggy write of the state C. Thus, the foggy write of the state C is performed to the selected memory cell MC. In this case, the state A to the state C are overwritten to the certain selected memory cell MC. At the timings of supplying the program voltages $V_{FOGPD}$ to $V_{FOGPG}$, the program inhibit voltage is supplied to the bit line BL connected to the memory cell MC corresponding to the state C. The magnitudes of the plurality of program voltages $V_{FOGPA}$ to $V_{FOGPG}$ have a relationship of $V_{FOGPA} < V_{FOGPB} < V_{FOGPC} < V_{FOGPD} < V_{FOGPE} < V_{FOGPF} < V_{FOGPG}$.

The program inhibit voltage may be supplied to the bit line BL connected to the memory cell MC corresponding to the state C while the program voltages $V_{FOGPA}$ and $V_{FOGPB}$ are supplied to the selected word line WL. In this case, the foggy write of the state C is performed to the certain selected memory cell MC at one time with the program voltage $V_{FOGPC}$.

For the other memory cells MC corresponding to the state A to the state G, the foggy write is performed with a similar method. During the foggy write, the confirmation of the threshold voltage by the verify operation is not necessary. The confirmation of the threshold voltage by the verify operation may be performed once after every foggy write terminates.

Figure 22C:
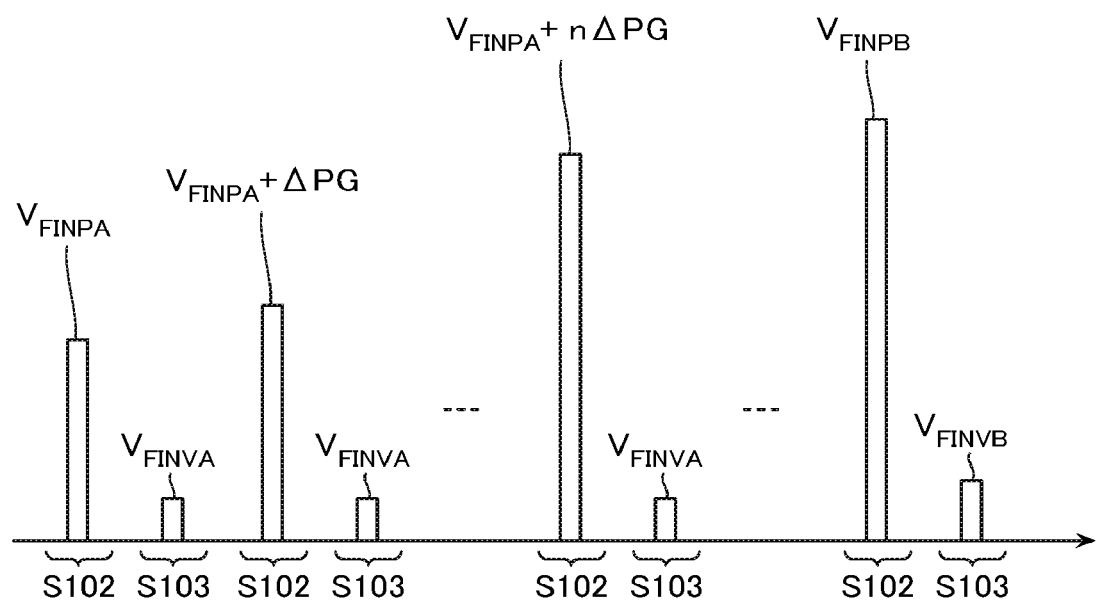
FIG. 22C is a schematic waveform diagram for describing the fast foggy fine write.

To the memory cells MC to which the fast foggy write operation has been performed, the fine write operation is performed. For example, as exemplified in FIG. 22C, the program operation (Step S102 of FIG. 12) and the verify operation (Step S103 of FIG. 12) are alternately executed to adjust the threshold voltage of the memory cell MC corresponding to the state A to the final target threshold voltage. Next, the program operation and the verify operation are alternately executed to adjust the threshold voltage of the memory cell MC corresponding to the state B to the final target threshold voltage. The same applies to the following, and the threshold voltages of the memory cells MC corresponding to the state C to the state G are adjusted to the final target threshold voltage. The program voltages $V_{FOGPA}$ to $V_{FOGPG}$ used for the fast foggy write operation are smaller than the program voltages $V_{FINPA}$ to $V_{FINPG}$ used for the fine write operation, respectively. ΔPG of FIG. 22C indicates an increased amount of the program voltage $V_{FOGPA}$ in accordance with the increase of the loop count n (FIG. 12).

The fast foggy fine write is executable in the order, for example, as illustrated in FIG. 19.

[Comparison of Write Sequences]

The inventors performed an experiment for comparing the above-described four write sequences. In the experiment, the above-described four write sequences were executed, and periods taken from the start to the termination of the execution and threshold distributions after the execution were compared. In the experiment, two kinds of samples were used. The used second sample has a thickness in the Z direction of the word line WL smaller than that of the first sample.

As the result of the comparison of the periods taken from the start to the termination of the execution, the full sequence write was the shortest while the foggy fine write was the longest. The two-stage write and the fast foggy fine write were similar.

Figure 23:
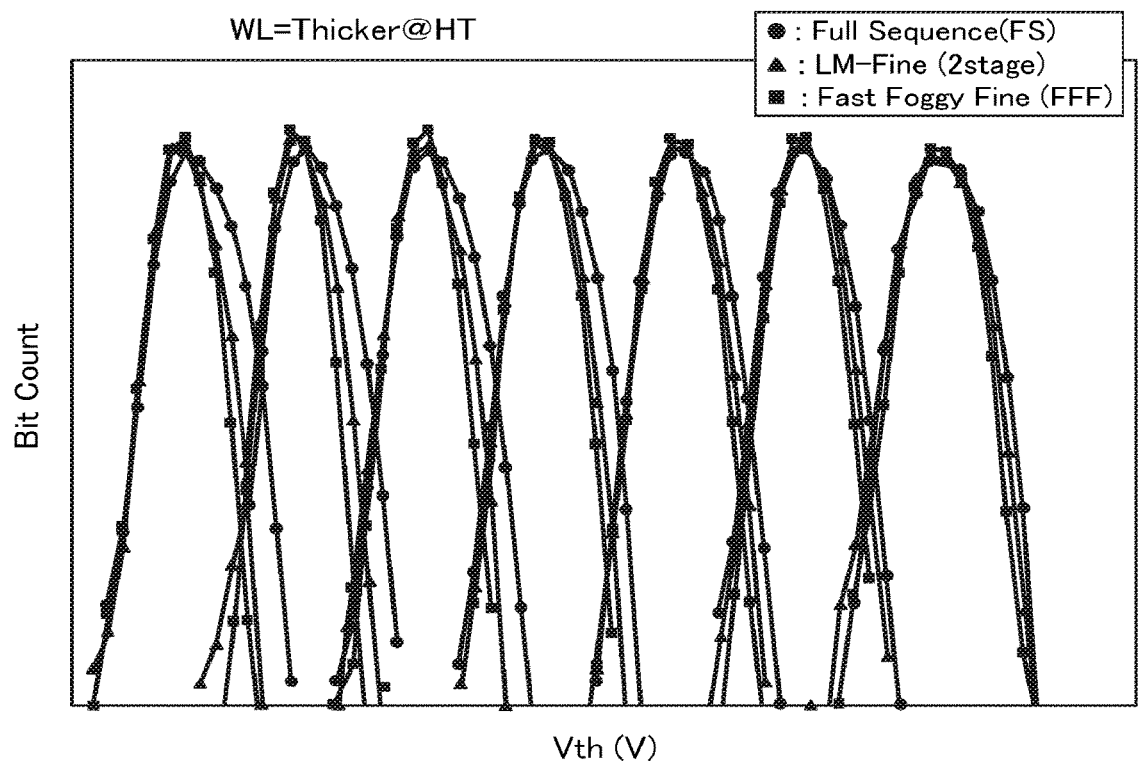
FIG. 23 is a histogram illustrating an experiment result by inventors.
Figure 24:
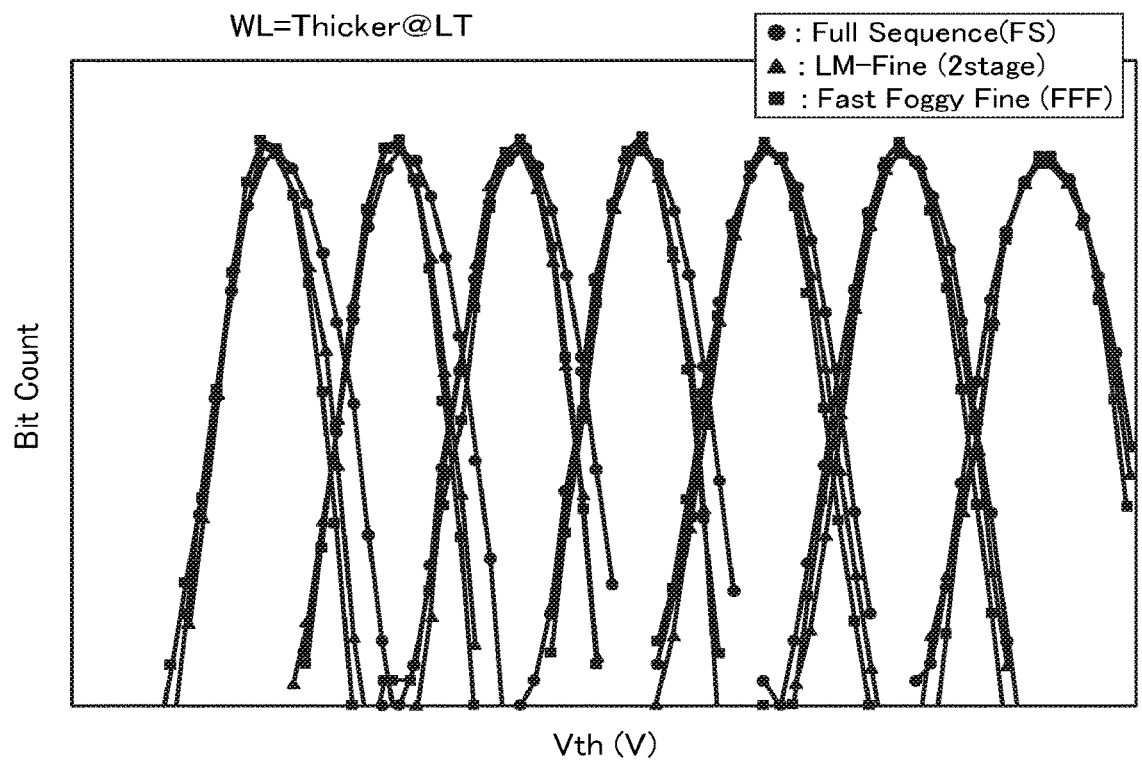
FIG. 24 is a histogram illustrating an experiment result by the inventors.
Figure 25:
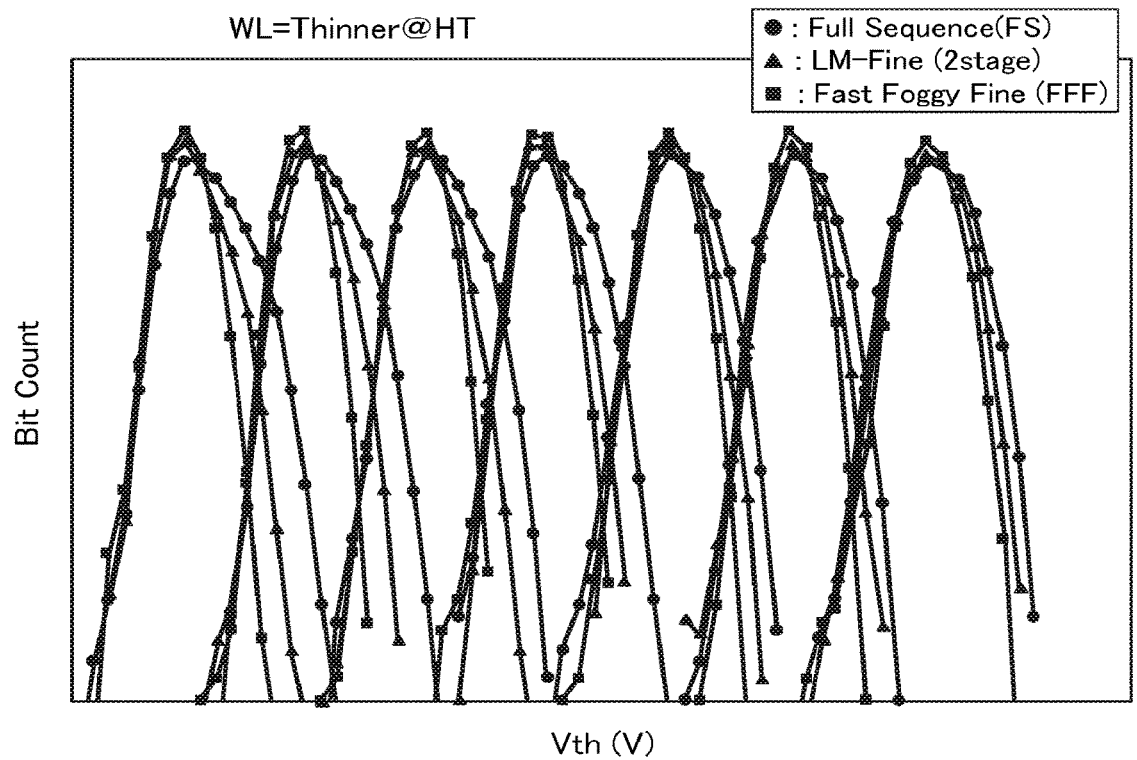
FIG. 25 is a histogram illustrating an experiment result by the inventors.
Figure 26:
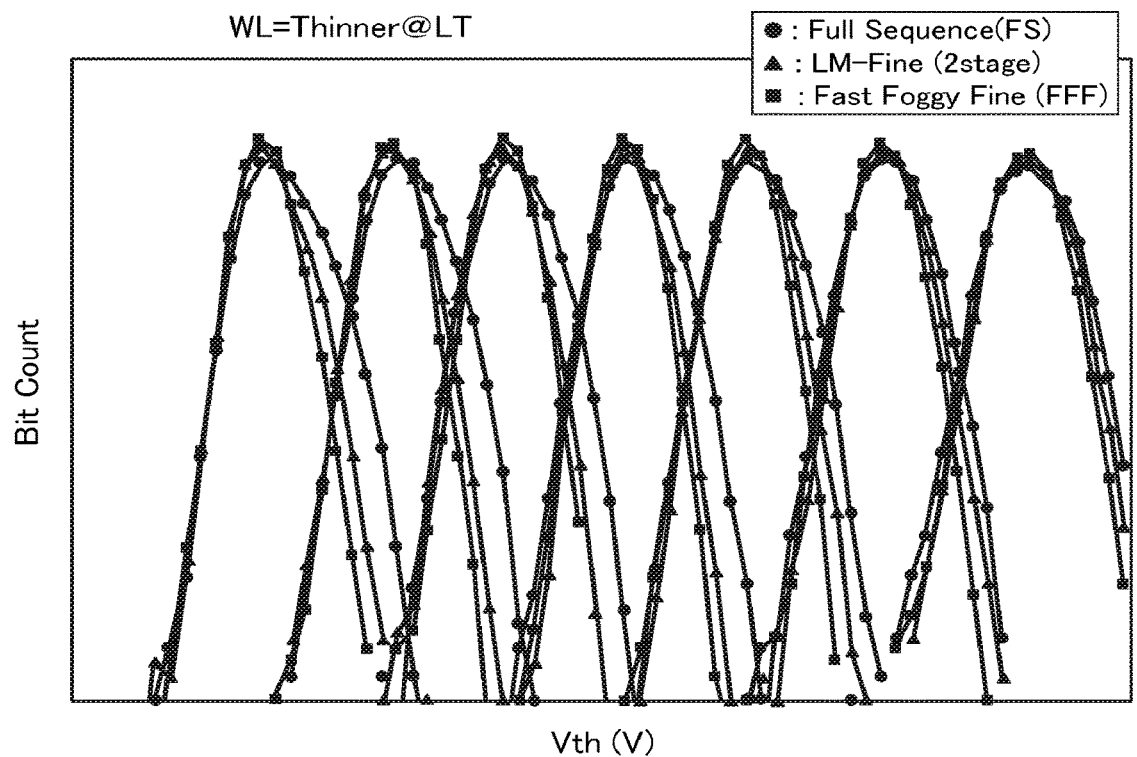
FIG. 26 is a histogram illustrating an experiment result by the inventors.

FIG. 23 to FIG. 26 are histograms illustrating the comparison results of the threshold distributions. FIG. 23 and FIG. 24 correspond to the first sample. FIG. 23 indicates the result of the experiment performed at a high temperature, and FIG. 24 indicates the result of the experiment performed at a low temperature. FIG. 25 and FIG. 26 correspond to the second sample. FIG. 25 indicates the result of the experiment performed at the high temperature, and FIG. 26 indicates the result of the experiment performed at the low temperature.

As illustrated in FIG. 23 to FIG. 26, the influence of the NWI was largest in the full sequence write, and such an influence was remarkable especially in the second sample. Meanwhile, the influence of the NWI was smallest in the fast foggy fine write. Especially in the second sample, the influence of the NWI was extremely reduced compared with the full sequence write and the two-stage write.

The above-described result shows that the fast foggy fine write ensures significant reduction of the influence of the NWI with the relatively fast processing. Additionally, it is found that such an effect is more remarkable in accordance with the miniaturization of the semiconductor memory device. As described above, the fast foggy fine write ensures the semiconductor memory device easy to miniaturize.

[Elimination of Program Voltage]

In the fast foggy fine write, eliminating the supply of one or a plurality of program voltages in the fast foggy write operation ensures further speed-up.

Figure 27:
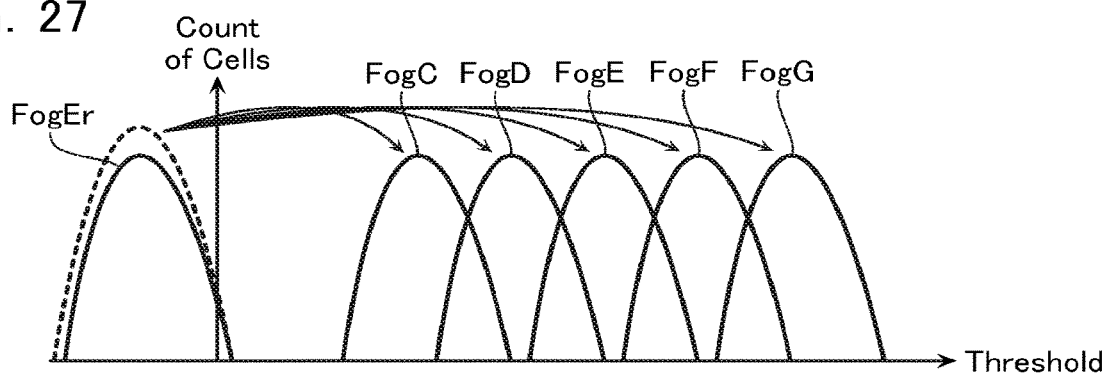
FIG. 27 is a schematic histogram for describing the fast foggy fine write.
Figure 28:
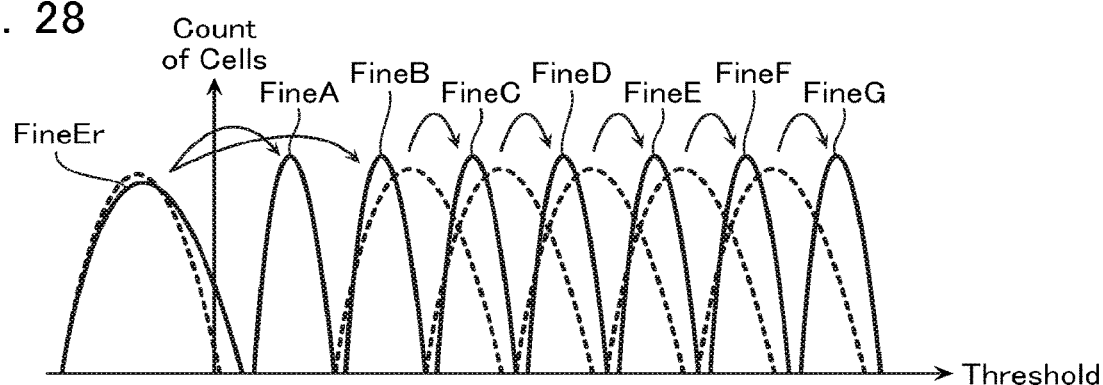
FIG. 28 is a schematic histogram for describing the fast foggy fine write.
Figure 29:
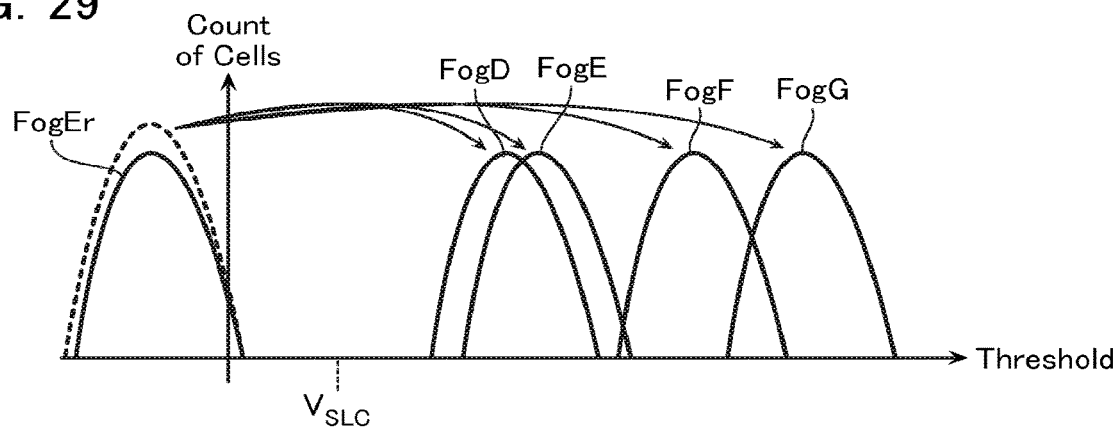
FIG. 29 is a schematic histogram for describing the fast foggy fine write.
Figure 30:
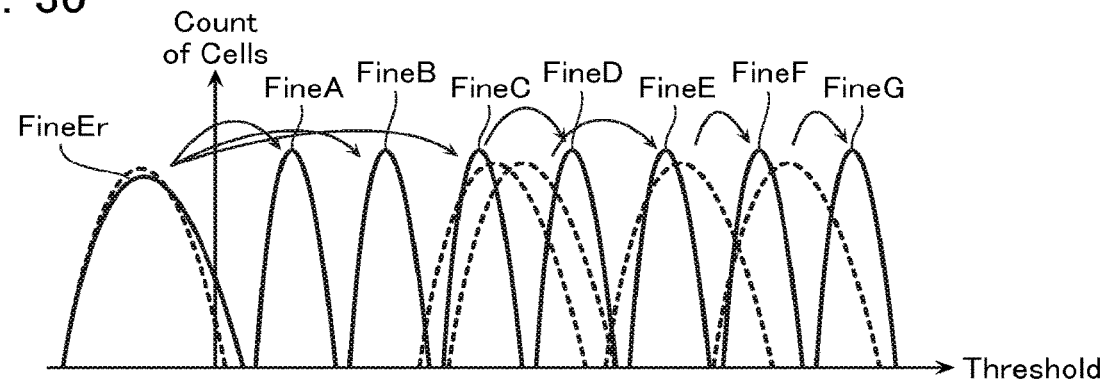
FIG. 30 is a schematic histogram for describing the fast foggy fine write.

For example, as illustrated in FIG. 27, the supply of the program voltage corresponding to the state A may be eliminated, or the supply of the program voltages corresponding to the state A and the state B may be eliminated. That is, on the state A and the state B, it is not necessary to perform the fast foggy write. After the fast foggy write of FIG. 27, as illustrated in FIG. 28, with the respective program voltages corresponding to the state A to the state G, the fine write is performed. As illustrated in FIG. 29, the supply of the program voltages corresponding to the state A to the state C may be eliminated. That is, on the state A to the state C, it is not necessary to perform the fast foggy write. After the fast foggy write of FIG. 29, as illustrated in FIG. 30, with the respective program voltages corresponding to the state A to the state G, the fine write is performed.

This ensures further speed-up in the fast foggy fine write. In the program operation of the lower states in the fine write operation, only the relatively small program voltages are supplied to the selected word line WL. Therefore, it seems that the NWI can be preferably reduced even if such supply of the program voltage is eliminated.

Additionally, for example, as illustrated in FIG. 29, in the fast foggy write, when the supply of the program voltages corresponding to the lower states (state A to state C) is eliminated while the program voltages corresponding to the upper states (state D to state G) are supplied, a certain voltage difference occurs between a threshold distribution FogEr corresponding to the lower state and a threshold distribution FogD corresponding to the state D at the point when the fast foggy write operation is performed. Therefore, for example, the allocation with the 1-3-3 code described with reference to FIG. 10A or the 1-2-4 code described with reference to FIG. 10B ensures the read operation to be executable at the point when the fast foggy write operation is performed. In this read operation, for example, a voltage $V_{SLC}$ between the threshold distribution FogEr and the threshold distribution FogD corresponding to the state D is supplied to the selected word line WL. This eliminates the need for storing the data of the low-order bit in the buffer memory SLCB. Accordingly, the area of the buffer memory SLCB in the memory cell array MCA can be reduced.

In this method, the memory cell MC to which the fast foggy write operation has been executed functions as a part of the buffer memory. Therefore, in the execution of the fine write operation, the data of the middle-order bit and the high-order bit is read from the buffer memory SLCB, and the data of the low-order bit is read from the selected page. This read is performed approximately similarly to the above-described read operation. However, the data of the low-order bit, the middle-order bit, and the high-order bit read through this read is not required to be output to the control die CD and the like. The fine write operation is executed after this read.

The fast foggy fine write ensures further speed-up by simultaneously supplying the program voltages to the memory cells MC corresponding to a plurality of states.

Figure 31:
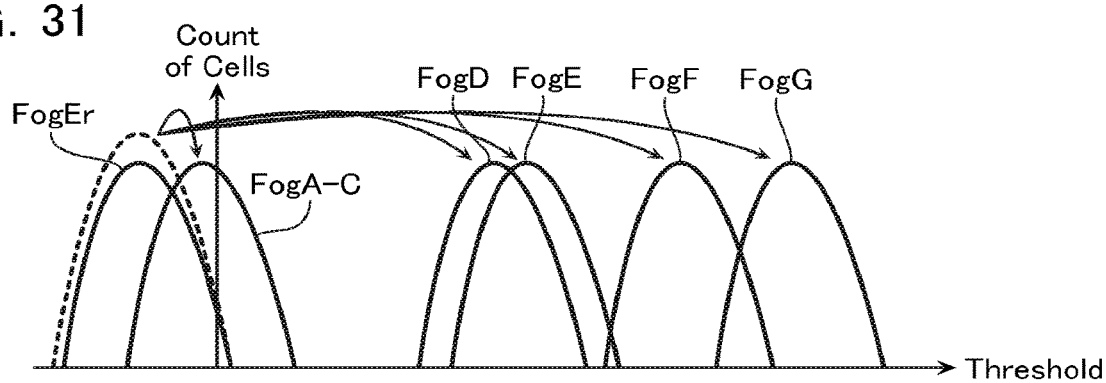
FIG. 31 is a schematic histogram for describing the fast foggy fine write.
Figure 32:
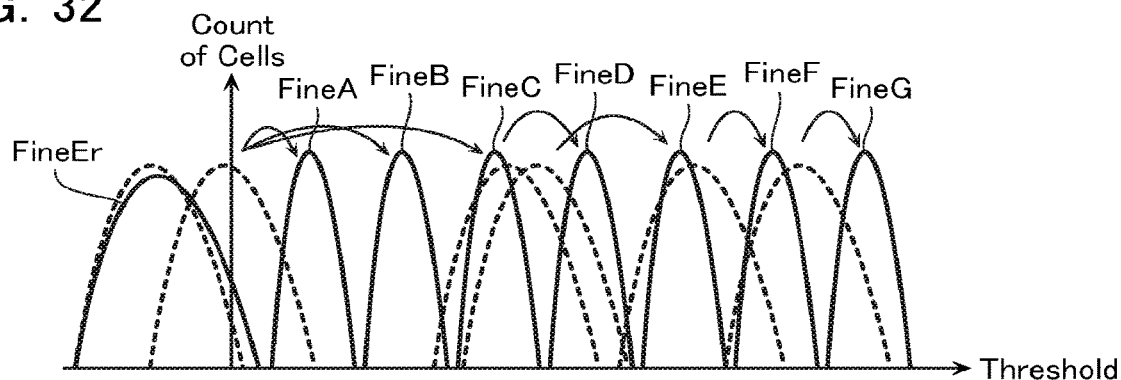
FIG. 32 is a schematic histogram for describing the fast foggy fine write.

For example, the memory cells MC corresponding to a plurality of lower states may be supplied with the program voltages identical in magnitude. In the example of FIG. 31, the memory cells MC corresponding to the state A to the state C are supplied with the program voltages identical in magnitude, and the state A to the state C are written in an identical state in the fast foggy write. Then, as illustrated in FIG. 32, with the respective program voltages corresponding to the state A to the state G, the fine write is performed. This ensures further speed-up in the fast foggy fine write. It seems that the NWI can be preferably reduced. The area of the buffer memory SLCB can be reduced.

Figure 33:
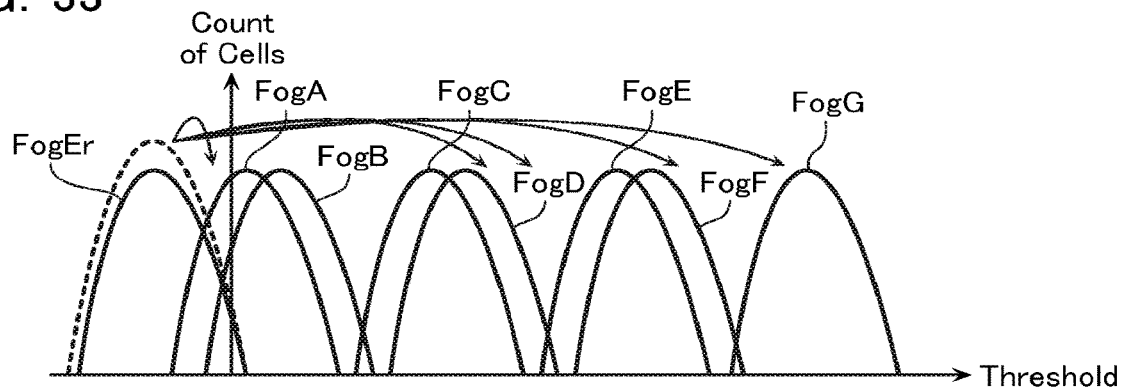
FIG. 33 is a schematic histogram for describing the fast foggy fine write.
Figure 34:
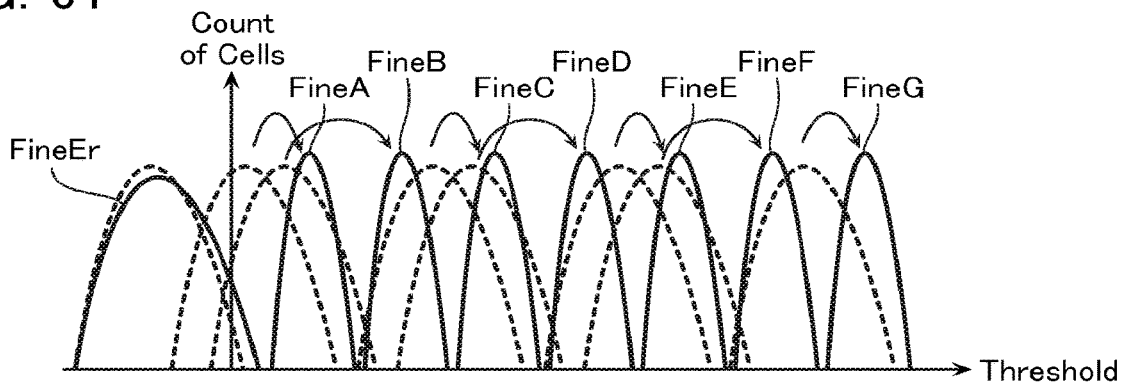
FIG. 34 is a schematic histogram for describing the fast foggy fine write.

Additionally, for example, through the control of the voltage of the bit line BL in a plurality of voltages, the different states can be simultaneously written to the memory cells MC corresponding to a plurality of states. In the fast foggy write illustrated in FIG. 33, the state A and the state B are written with an identical program voltage, the state C and the state D are written with an identical program voltage, and the state E and the state F are written with an identical program voltage. Subsequently, as illustrated in FIG. 34, the state A and the state B may be performed with the fine write with the identical program voltage, the state C and the state D may be performed with the fine write with the identical program voltage, and the state E and the state F may be performed with the fine write with the identical program voltage.

The voltage of the bit line BL is adjustable with various methods. For example, the data of the data latch SDL corresponding to the bit line BL of a predetermined state may be turned from "H" to "L" or "L" to "H" at the charge or the like of the bit line BL, or at least one of the node N0 and the node N1 of the sense amplifier SA may be connected to two kinds of voltage supply lines.

Other Embodiment

Figure 35:
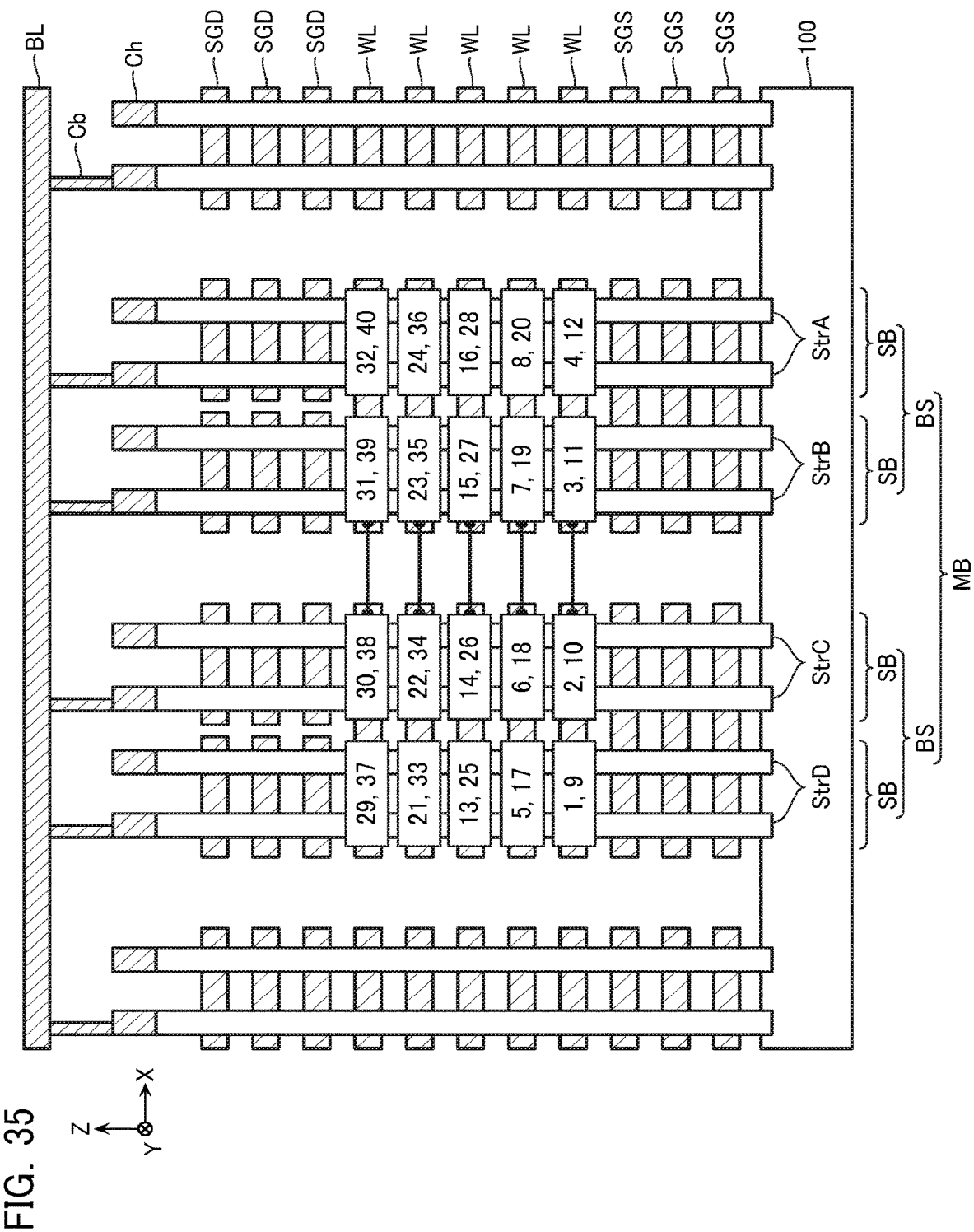
FIG. 35 is a schematic cross-sectional view for describing an order of a write operation in the fast foggy fine write.

For example, the write sequence such as the fast foggy fine write is executable in the order as illustrated in FIG. 19. However, for example, as illustrated in FIG. 35, the write sequence may be executed such that the fast foggy write operation and the like is executed on the pages corresponding to the word lines WL of the lowermost layer, the fast foggy write operation and the like is executed on the pages corresponding to the word lines WL of the second layer, the fine write operation is executed on the pages corresponding to the word lines WL of the lowermost layer, the fast foggy write operation and the like is executed on the pages corresponding to the word lines WL of the third layer, the fine write operation is executed on the pages corresponding to the word lines WL of the second layer, the same applies to the following, and the fast foggy write operation and the fine write operation are alternately performed for each word line WL.

The above description has used the example where, for example, as illustrated in FIG. 10A, the threshold voltages of the memory cells MC are controlled in the eight states, and the 3-bit data is stored in each memory cell MC. However, the number of bits of the data stored in the memory cell MC is appropriately changeable insofar as the data has a plurality of bits of 2-bit or more. For example, when k-bit data (k is an integer of 2 or more) is stored in the memory cell MC, the memory cell MC is controlled in $2^k$ states.

For example, as illustrated in FIG. 36A, the threshold voltages of the respective memory cells MC may be controlled in 16 states to store 4-bit data in each memory cell MC. Even in this case, for example, as illustrated in FIG. 36B, the allocation may be performed such that the data of the first bit is distinguishable with one read voltage, the data of the second bit is distinguishable with two read voltages, the data of the third bit is distinguishable with four read voltages, and the data of the fourth bit is distinguishable with eight read voltages. Such a data allocation method is referred to as a 1-2-4-8 code in some cases. Even in this case, the area of the buffer memory SLCB can be reduced by the combination with the method as illustrated in, for example, FIG. 29 to FIG. 32.

The above-described 1-3-3 code (FIG. 10B), 1-2-4 code (FIG. 10C), 1-2-4-8 code (FIG. 36B), and similar code each have the allocation where the data of the low-order bit is distinguishable with one read voltage. However, for example, as a 3-1-3 code and a 3-3-1 code, the allocation where the data other than the low-order bit is distinguishable with one read voltage is employable.

In FIG. 15, FIG. 19, FIG. 35, and the like, the write of the data is performed from the source side (side on which the source line exists) of the memory string. However, the write of the data may be performed from the drain side (side on which the bit line exists) of the memory string. This ensures the reduction of the NWI.

The semiconductor memory device according to the embodiment has been described above. However, the above-described description is merely an example, and the above-described configuration, method, and the like are appropriately adjustable. The above-described plurality of embodiments can be combined with one another.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory string that includes a first memory transistor and a second memory transistor, the first memory transistor and the second memory transistor having a plurality of threshold voltages;
    a first word line connected to a gate electrode of the first memory transistor;
    a second word line connected to a gate electrode of the second memory transistor; and
    a controller that performs a write operation and a read operation to the first memory transistor and the second memory transistor, the write operation including a program operation and a verify operation, wherein
    the controller executes:
        a first write operation to write a first threshold voltage to the first memory transistor where data write is performed using only the program operation;
        a second write operation to write a second threshold voltage to the second memory transistor where data write is performed using only the program operation;
        a third write operation to write a third threshold voltage to the first memory transistor where data write is performed using the program operation and the verify operation, the third threshold voltage being higher than the first threshold voltage; and
        a fourth write operation to write a fourth threshold voltage to the second memory transistor where data write is performed using the program operation and the verify operation, the fourth threshold voltage being higher than the second threshold voltage, wherein
    the first to the fourth write operations are executed in this order.

2. The semiconductor memory device according to claim 1, wherein
    the controller:
        executes the verify operation after termination of the program operation and outputs information that indicates whether the first write operation has normally terminated in the first write operation; and
        executes the verify operation after the termination of the program operation and outputs information that indicates whether the second write operation has normally terminated in the second write operation.

3. The semiconductor memory device according to claim 2, wherein
    the controller:
        classifies the first memory transistor as a defective cell when the information output in the first write operation indicates that the first write operation has not normally terminated; and
        classifies the second memory transistor as a defective cell when the information output in the second write operation indicates that the second write operation has not normally terminated.

4. The semiconductor memory device according to claim 1, wherein
    the controller:
        executes the program operation and the verify operation only once in the first write operation;
        executes the program operation and the verify operation only once in the second write operation;
        alternately executes the program operation and the verify operation multiple times in the third write operation; and
        alternately executes the program operation and the verify operation multiple times in the fourth write operation.

5. The semiconductor memory device according to claim 4, wherein
    the controller:
        terminates the first write operation after the execution of the verify operation regardless of a result of the verify operation in the first write operation;
        terminates the second write operation after the execution of the verify operation regardless of a result of the verify operation in the second write operation;

continues or terminates the third write operation corresponding to a result of the verify operation in the third write operation; and continues or terminates the fourth write operation corresponding to a result of the verify operation in the fourth write operation.

6. The semiconductor memory device according to claim 1, wherein when a largest program voltage supplied to the first memory transistor in the first write operation is a first program voltage in a case where data written to the first memory transistor corresponds to a largest threshold voltage among the plurality of threshold voltages, and when a largest program voltage supplied to the first memory transistor in the first write operation is a second program voltage in a case where the data written to the first memory transistor corresponds to a second largest threshold voltage among the plurality of threshold voltages, the first program voltage is larger than the second program voltage.

7. The semiconductor memory device according to claim 1, wherein the first memory transistor and the second memory transistor each store data of k bits (k is an integer of 2 or more), $2^k$ states corresponding to the k-bit data includes all the states corresponding to threshold voltages smaller than a predetermined threshold voltage and all the states corresponding to threshold voltages larger than the predetermined threshold voltage, a predetermined bit in the k bits of one of the former states and the latter states is allocated with "0", and the predetermined bit in the k bits of the other one of the former states and the latter states is allocated with "1", and a read operation to read the predetermined bit of the first memory transistor is performed after the execution of the second write operation and before the execution of the third write operation.

8. The semiconductor memory device according to claim 7, wherein a count of program voltages supplied to the first word line in the first write operation is smaller than $2^k-1$.

9. The semiconductor memory device according to claim 1, wherein the second memory transistor is disposed adjacent to the first memory transistor.

10. A semiconductor memory device comprising:

a memory string that includes a first memory transistor and a second memory transistor;

a first word line connected to a gate electrode of the first memory transistor;

a second word line connected to a gate electrode of the second memory transistor; and a controller connected to the first memory transistor and the second memory transistor, the controller causing the first memory transistor and the second memory transistor to each store data of k bits (k is an integer of 2 or more), wherein the controller executes:

a first write operation to supply the first word line with more than one and less than $2^k$ program voltages, the program voltages being different in magnitude, the program voltages being supplied once for each, a second write operation to supply the second word line with more than one and less than $2^k$ program voltages, the program voltages being different in magnitude, the program voltages being supplied once for each, a third write operation to supply the first word line with $2^k$ or more program voltages, the program voltages being different in magnitude, and a fourth write operation to supply the second word line with $2^k$ or more program voltages, the program voltages being different in magnitude, wherein the first to the fourth write operations are executed in this order.

11. The semiconductor memory device according to claim 10, wherein the controller:

supplies a verify voltage to the first word line after the supply of the program voltages and outputs information that indicates whether the first write operation has normally terminated in the first write operation; and supplies a verify voltage to the second word line after the supply of the program voltages and outputs information that indicates whether the second write operation has normally terminated in the second write operation.

12. The semiconductor memory device according to claim 11, wherein the controller:

classifies the first memory transistor as a defective cell when the information output in the first write operation indicates that the first write operation has not normally terminated; and classifies the second memory transistor as the defective cell when the information output in the second write operation indicates that the second write operation has not normally terminated.

13. The semiconductor memory device according to claim 10, wherein the controller:

does not supply a verify voltage to the first word line until every program voltage is supplied in the first write operation;

does not supply the verify voltage to the second word line until every program voltage is supplied in the second write operation;

supplies the verify voltage every time when the program voltage is supplied in the third write operation; and supplies the verify voltage every time when the program voltage is supplied in the fourth write operation.

14. The semiconductor memory device according to claim 10, wherein $2^k$ states corresponding to the k-bit data includes all the states corresponding to threshold voltages smaller than a predetermined threshold voltage and all the states corresponding to threshold voltages larger than the predetermined threshold voltage, a predetermined bit in the k bits of one of the former states and the latter states is allocated with "0", and the predetermined bit in the k bits of the other one of the former states and the latter states is allocated with "1", and the first word line is supplied with a read voltage after the execution of the second write operation and before the execution of the third write operation.

15. The semiconductor memory device according to claim 14, wherein a count of program voltages supplied to the first word line in the first write operation is smaller than $2^k-1$.

16. The semiconductor memory device according to claim 10, wherein
the second memory transistor is disposed adjacent to the first memory transistor.

* * * * *